(12) United States Patent
Nakamura

(10) Patent No.: US 6,248,967 B1
(45) Date of Patent: Jun. 19, 2001

(54) IC TESTING APPARATUS

(75) Inventor: Hiroto Nakamura, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/290,400

(22) Filed: Apr. 13, 1999

(30) Foreign Application Priority Data

Apr. 14, 1998 (JP) .................................................. 10-120143

(51) Int. Cl.[7] .............................. B07C 5/344; B65H 1/00
(52) U.S. Cl. .................. 209/573; 209/909; 414/222.09; 414/940; 324/158.1
(58) Field of Search ..................................... 209/571, 573, 209/909, 921; 414/222.01, 222.09, 935, 940; 324/754, 158.1; 198/346.2

(56) References Cited

U.S. PATENT DOCUMENTS

| | | | | |
|---|---|---|---|---|
| 4,981,408 | * | 1/1991 | Hughes et al. | 414/222.09 X |
| 5,104,277 | * | 4/1992 | Bullock | 324/158.1 X |
| 5,788,084 | * | 8/1998 | Onishi et al. | 209/573 |

* cited by examiner

Primary Examiner—Tuan N. Nguyen
(74) Attorney, Agent, or Firm—Birch, Stewart, Kolasch & Birch LLP

(57) ABSTRACT

A tray transfer arm 205 for transferring one or more customer trays KST which hold semiconductor devices IC, comprises a pair of tray holders 205a, 205b which are provided substantially in the upper and lower direction.

16 Claims, 22 Drawing Sheets

IC TESTING APPARATUS

BACKGROUND OF THE INVENTION

Field of the Invention

The present invention relates to an IC testing apparatus for testing a semiconductor integrated circuit device (hereinafter referred to as an "IC"), more particularly relates to a tray transfer arm, a tray transfer apparatus using the arm, an IC testing apparatus, and a tray handling method.

This type of IC testing apparatus, called a "handler", conveys a large number of ICs held on a tray to the inside of a testing apparatus where the ICs are made to electrically contact a test head, then the IC testing apparatus is made to perform the test. When the test is ended, the ICs are conveyed from the test head and reloaded on trays in accordance with the results of the tests so as to sort them into categories of good ICs and defective ones.

In a conventional IC testing apparatus, the trays for holding the ICs to be tested or the tested ICs (hereinafter referred to the "customer trays") and the trays conveyed through the IC testing apparatus (hereinafter referred to as the "test trays") are different in type, so the ICs are reloaded before the test and after the test.

When reloading the ICs finished being test from the test tray to the customer tray, a number of empty customer trays corresponding to the different categories, such as "good ICs" and "defective ICs", are prepared and the ICs reloaded there from the test tray. When a customer tray becomes full, it is necessary to convey it out and prepare a new empty tray. Therefore, a device called a "tray transfer arm" is built into the IC testing apparatus.

In such a conventional IC testing apparatus, however, a large number of operation steps were required to convey the full customer tray out and set the next empty tray. In particular, since the setting of the next tray was the last step, there was the problem that the operation of reloading the ICs ended up being stopped during that interval and the throughput (number of ICs processed by the handler per unit time) falls.

SUMMARY OF THE INVENTION

It is an object of the present invention to provide a tray transfer arm, a tray transfer apparatus using the same, an IC testing apparatus, and a tray handling method able to reduce the steps of operation at the time exchange of trays and increase the throughput.

Tray Transfer Arm (1-1) To achieve the above object, according to a first aspect of the present invention, there is provided a tray transfer arm characterized in that a pair of tray holders are provided substantially in the upper and lower direction.

In the tray transfer arm of the present invention, since the pair of tray holders are provided substantially in the upper and lower direction, when exchanging trays, it is possible to perform the operation of conveying a tray out and the operation of conveying a tray in at fixed positions and possible to eliminate the operation of moving the tray transfer arm in the lateral direction between the operation of conveying a tray out and the operation of conveying a tray in. Therefore, since the operation steps at the time of exchange of trays are reduced and another tray can be conveyed in immediately after a tray is conveyed out, the throughput in the work for reloading ICs on trays etc. is remarkably improved. Further, in the tray transfer arm of the present invention, since the pair of tray holders are provided substantially in the upper and lower direction, in particular, the range of movement in the horizontal direction when using the arm for an IC testing apparatus becomes wider.

(1-2) The above invention may be configured so that the pair of tray holders move together, but it is more preferable to provide a drive means for making the pair of tray holders move independently substantially in the upper and lower direction.

By doing this, the operation of conveying a tray out and the operation of conveying the next tray in can be performed simultaneously, the operation steps at the time of exchange of trays is further reduced, and the throughput at the time of the work for reloading ICs etc. is further improved.

(1-3) Further, in the above invention, the structure of the pair of tray holders is not particularly limited and may be configured to store trays in the same direction, but it is more preferable that the pair of tray holders be provided facing away from each other.

The "tray holders be provided facing away from each other" means that the tray holders are designed so that the directions of transfer of the trays with respect to the tray holders when storing the trays are opposite to each other. When the pair of tray holders are provided vertically, trays are stored from the top to the bottom in the upper side tray holder and trays are stored from the bottom to the top in the lower side tray holder.

By doing this, the operation of storing the trays to be conveyed out in the lower side tray holder and the operation of storing the trays to be conveyed in from the upper side tray holder can be performed simultaneously without being accompanied with other operations, the operation steps at the time of exchange of trays is further reduced, and the throughput of the work for reloading ICs etc. is further improved.

Tray Transfer Apparatus (2-1) Further, to achieve the above object, according to a second aspect of the present invention, there is provided a tray transfer apparatus for resetting a first tray set at a first position to a second position and resetting a second tray set at a third position to the first position, said tray transfer apparatus characterized by being provided with a tray transfer means provided substantially in the upper and lower direction with at least one pair of tray holders able to store the first and second trays, the pair of tray holders provided to be able to move substantially in the upper and lower direction.

The tray transfer means of the present invention is provided with a pair of tray holders substantially in the upper and lower direction, so when exchanging trays, first, a second tray set at a third position is stored in one of the upper and lower tray holders and moved to an exchange position, a first tray set at the first position is stored in the other of the upper and lower tray holders there, then the second tray stored in the one of the upper and lower tray holders is set to the first position.

In this way, since the operation of making the tray transferring means move in the lateral direction is not required between the operation of conveying the first tray out and the operation of conveying the second tray in, the operation steps at the time of exchanging trays are reduced and a second tray can be conveyed in to the first position immediately after a first tray is conveyed out of the first position, so the throughput in the work for reloading ICs etc. on a tray is remarkably improved. Further, since the tray transferring means according to the present invention is provided with a pair of tray holders substantially in the upper and lower direction, when using the tray transfer apparatus of the present invention for an IC testing apparatus, the range of movement in the horizontal direction becomes wider.

(2-2) In the present invention, while not particularly limited, it is more preferable that further provision be made of a tray elevating means for carrying a first tray set to the first position and moving it substantially in the upper and lower direction.

That is, a first tray set to the first position is made to move in the upper and lower direction by the tray elevating means and a second tray stored in one of the tray holders of the tray transfer arm is set to the first position during that time.

Due to this, the time for exchanging trays at the first position becomes shorter and the throughput of the work for reloading ICs etc. on a tray is remarkably improved.

(2-3) The present invention is not particularly limited in the positional relationship of the first to third positions. All positions may be located on the same horizontal plane or for example the second position and the third position may be positioned at least at either a substantially upper direction, lower direction, or horizontal direction with respect to the first position.

(2-4) The present invention is not particularly limited in the specific configuration of the first to third positions, but as one example the first position is a tray unloader section, the second and third positions are tray stockers, the first tray is a tray on which DUTs (devices under test) finished being tested are loaded, and the second tray is an empty tray.

(2-5) Further, as another example, the first position is a tray loader section, the second and third positions are tray stockers, the first tray is an empty tray from which DUTs have finished being unloaded, and the second tray is a tray on which DUTs to be tested are loaded.

(2-6) In the present invention, while not particularly limited to this, it is preferable to further provide a tray setting means for setting the second tray in one of the tray holders of the tray transfer means.

By providing such a tray setting means, the operation steps of the tray transfer arm itself are reduced, so the speed of exchanging trays becomes faster and the throughput is also improved.

IC Testing Apparatus (3-1) To solve the above object, according to a third aspect of the present invention, there is provided an IC testing apparatus which inserts a first type of tray on which DUTs are carried into a loader section, reloads the DUTs to a second type of tray to be conveyed through a test process, inserts the second type of tray into the test process to test the DUTs, stores the test results for each DUT, takes out the second type of tray finished being tested to an unloader section, and reloads the DUTs from the second type of tray to the first type of tray in accordance with the test results and ejects the first type of tray finished being reloaded with the DUTs from the second type of tray in the unloader sector from that unloader section and inserts another first type of tray into that unloader section, said IC testing apparatus characterized in that further provision is made of a tray transfer means provided substantially in the upper and lower direction with at least one pair of tray holders able to store the first type of tray.

Since the tray transfer means of the present invention is provided with a pair of tray holders substantially in the upper and lower direction, when exchanging first types of trays in the unloader section, first another first type of tray is stored in one of the upper and lower tray holders and moved to the unloader section the first type of tray set in the unloader section is stored at the other of the upper and lower tray holders there, and the other first type of tray stored at the one of the upper and lower tray holders is set in the unloader section.

In this way, since the operation of making the tray transfer means move in the later direction is not required between the operation of conveying the first type of tray out and the operation of conveying it in, the operation steps when exchanging trays are reduced and the other first type of tray can be conveyed to the unloader section immediately after the first type of tray is conveyed out from the unloader section, so the throughput of the work for reloading ICs etc. from the second type of tray to the first type of tray is remarkably improved.

(3-2) In the present invention, the pair of tray holders of the tray transfer means may be configured to move together, but it is more preferable that provision be made of a drive means for making the pair of tray holders move independently in substantially the upper and lower direction.

By doing this, the operation of conveying a tray out and the operation of conveying the next tray in can be performed simultaneously, the operation steps when exchanging trays is further reduced, and the throughput of the work for reloading ICs etc. is further improved.

(3-3) In the present invention, while not particularly limited to this, it is preferable that further provision be made of a tray elevating means for carrying the first type of tray set in the unloader section and making it move in the upper and lower direction.

That is, a first type of tray set to the unloader section is made to move in the upper and lower direction by the tray elevating means and another first type of tray stored in one of the tray holders of the tray transfer means is set to the unloader section during that time.

Due to this, the time for exchanging trays in the unloader section becomes shorter and the throughput of the work for reloading ICs etc. from the second type of tray to the first type of tray is remarkably improved.

(3-4) In the present invention, while not particularly limited to this, it is preferable that further provision be made of a tray setting means for setting another first type of tray in one of the tray holders of the tray transfer means.

By providing such a tray setting means, the operation steps of the tray transfer means itself are reduced, so the speed of exchanging trays becomes faster and the throughput is also improved.

(3-5) In the present invention, while not particularly limited to this, it is preferable that the unloader section be provided with a holding means for holding the first type of tray.

By providing such a holding means, it is possible to make the tray elevating means move freely while the first type of tray is set in the unloader section and the tray elevating means and tray transfer means can be operated simultaneously, so the operation steps can be further reduced.

(3-6) In the present invention, while not particularly limited to this, it is preferable that a plurality of pairs of unloader sections be provided substantially in the horizontal direction and a plurality of pairs of tray holders of the tray transfer means be provided substantially in the horizontal direction at the same pitch as the unloader sections.

By making the pitch of the unloader sections and the pitch of the tray transfer means the same, it is possible to send trays or receive trays to or from the unloader sections simultaneously and possible to further reduce the operation steps.

(3-7) In the present invention, while not particularly limited to this, it is preferable that one of the tray holders of the tray transfer means be able to temporarily receive a first type of tray in the middle of reloading of DUTs in the unloader section.

In an IC testing apparatus, the number of trays which can be arranged in an unloader sector is limited and the number of categories which ICs can be sorted into in real time is limited. Therefore, when a DUT arises which is classified into a category other than the categories of the trays arranged in the unloader section, it is necessary to suspend the sorting work and temporarily switch a tray presently arranged in the unloader section with a tray of that category. The throughput is reduced by that amount.

By temporarily depositing a tray in the middle of reloading at the unloader section in the tray transfer means as in the present invention, however, the operation steps and the operation distance become shorter than transfer to the original position, so the speed of exchanging trays is made faster.

(4-1) To achieve the above object, according to a third aspect of the present invention, there is provided an IC testing apparatus which inserts a first type of tray on which DUTs are carried into a loader section, reloads the DUTs to a second type of tray to be conveyed through a test process, inserts the second type of tray into the test process to test the DUTs, stores the test results for each DUT, takes out the second type of tray finished being tested to an unloader section, and reloads the DUTs from the second type of tray to the first type of tray in accordance with the test results and
 ejects the first type of tray finishing reloading the DUTs to the second type of tray in the loader sector from that loader section and inserts the first type of tray loaded with the DUTS to be tested next into that loader section,
 said IC testing apparatus characterized in that further provision is made of a tray transfer means provided substantially in the upper and lower direction with at least one pair of tray holders able to store the first type of tray.

Since the tray transfer means of the present invention is provided with a pair of tray holders substantially in the upper and lower direction, when exchanging first types of trays in the loader section, first another first type of tray to be tested next is stored in one of the upper and lower tray holders and moved to the loader section, the first type of tray set in the loader section is stored at the other of the upper and lower tray holders there, and the first type of tray stored at the one of the upper and lower tray holders is set in the loader section.

In this way, since the operation of making the tray transfer means move in the later direction is not required between the operation of conveying the first type of tray out and the operation of conveying it in, the operation steps when exchanging trays are reduced and the other first type of tray can be conveyed to the loader section immediately after the first type of tray is conveyed out from the loader section, so the throughput of the work for reloading ICs etc. from the first type of tray to the second type of tray is remarkably improved.

(4-2) In the present invention, the pair of tray holders of the tray transfer means may be configured to move together, but it is more preferable that provision be made of a drive means for making the pair of tray holders move independently in substantially the upper and lower direction.

By doing this, the operation of conveying a tray out and the operation of conveying the next tray in can be performed simultaneously, the operation steps when exchanging trays is further reduced, and the throughput of the work for reloading ICs etc. is further improved.

(4-3) In the present invention, while not particularly limited to this, it is preferable that further provision be made of a tray elevating means for carrying the first type of tray set in the loader section and making it move in the upper and lower direction.

That is, a first type of tray set to the loader section is made to move in the upper and lower direction by the tray elevating means and another first type of tray stored in one of the tray holders of the tray transfer means is set to the loader section during that time.

Due to this, the time for exchanging trays in the loader section becomes shorter and the throughput of the work for reloading ICs etc. from the first type of tray to the second type of tray is remarkably improved.

(4-4) In the present invention, while not particularly limited to this, it is preferable that further provision be made of a tray setting means for setting a first type of tray on which DUTs to be tested next are loaded in one of the tray holders of the tray transfer means.

By providing such a tray setting means, the operation steps of the tray transfer means itself are reduced, so the speed of exchanging trays becomes faster and the throughput is also improved.

(4-5) In the present invention, while not particularly limited to this, it is preferable that the loader section be provided with a holding means for holding the first type of tray.

By providing such a holding means, it is possible to make the tray elevating means move freely while the first type of tray is set in the loader section and the tray elevating means and tray transfer means can be operated simultaneously, so the operation steps can be further reduced.

(4-6) In the present invention, while not particularly limited to this, it is preferable that a plurality of pairs of loader sections be provided substantially in the horizontal direction and a plurality of pairs of tray holders of the tray transfer means be provided substantially in the horizontal direction at the same pitch as the loader sections.

By making the pitch of the loader sections and the pitch of the tray transfer means the same, it is possible to send trays or receive trays to or from the loader sections simultaneously and possible to further reduce the operation steps.

(4-7) In the above third and fourth aspects of the invention, it is preferable that further provision be made of a sensor for detecting if the first type of tray is stored in the tray holder.

Tray Handling Method (5-1) To achieve the above object, according to a fifth aspect of the present invention, there is provided a tray handling method which makes a first type of tray set to a first position move to a second position located at least substantially in the lower direction with respect to the first position, then makes a second tray set to a third position located at least substantially in the lower direction with respect to the first position to the first position,
 said tray handling method characterized by storing the second trays in a tray holder at the upper side of a tray transfer arm provided between the first position and the second or third position and able to store at least two trays substantially in the upper and lower direction, moves it to the first position along with the lower side tray holder, stores the first tray in the lower side tray holder and makes the upper side tray holder move in the upper direction to set the second tray stored in the tray holder to the first position.

Since the tray transfer arm of the present invention is provided with a pair of tray holders substantially in the upper and lower direction, when exchanging trays at the first position, first a second tray set at the third position is stored in one of the upper and lower tray holders and moved to the first position, a first trays set at the first position is stored in the other of the upper and lower tray holders there, then the second tray stored in the one of the upper and lower tray holders is set at the first position.

In this way, since the operation of making the tray transfer means move in the later direction is not required between the operation of conveying the first tray out and the operation of conveying the second tray in at the first position, the operation steps when exchanging trays are reduced and the second tray can be conveyed to first position immediately after the first tray is conveyed out from the first position, so the throughput of the work for reloading ICs etc. to the first tray is remarkably improved.

(5-2) In the tray handling method of the present invention, when temporarily switching a first tray at the first position with a second tray at a second position or a third tray at a third position, it is preferable to temporarily deposit the first tray in one of the tray holders of the tray transfer arm, set the second or third tray to the first position, eject the second or third tray from the first position, then reset the first tray stored in the tray holder at the first position.

By temporarily depositing a tray in the middle of reloading at the first position in a tray holder of the tray transfer arm, the operation steps and the operation distance become shorter compared with transfer to the original second or third position, so the speed of exchanging trays is further increased.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Embodiments of the present invention will be explained below based on the drawings.

First Embodiment

Figure 1:
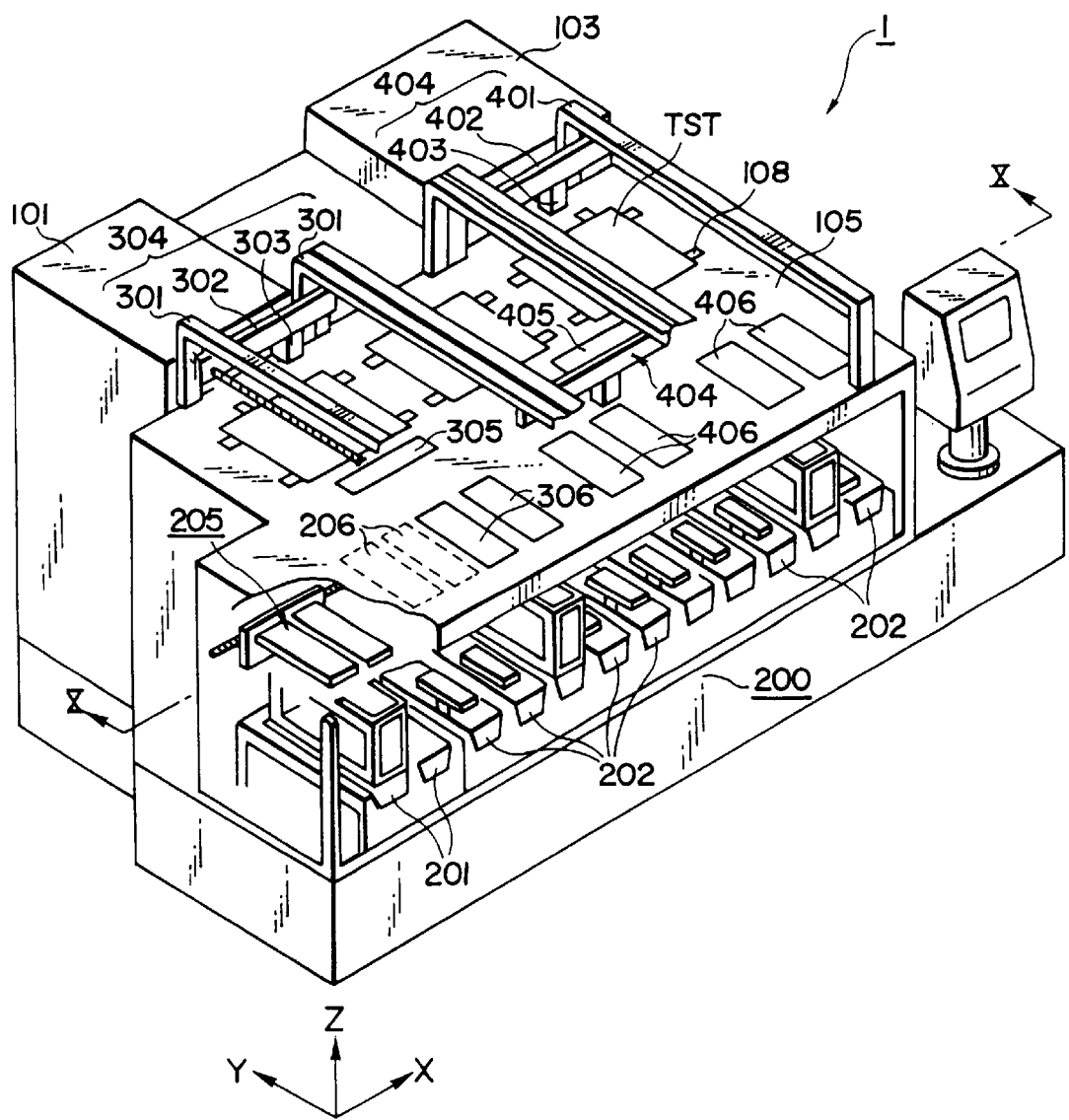
FIG. 1 is a perspective view of an embodiment of an IC testing apparatus of the present invention.
Figure 2:
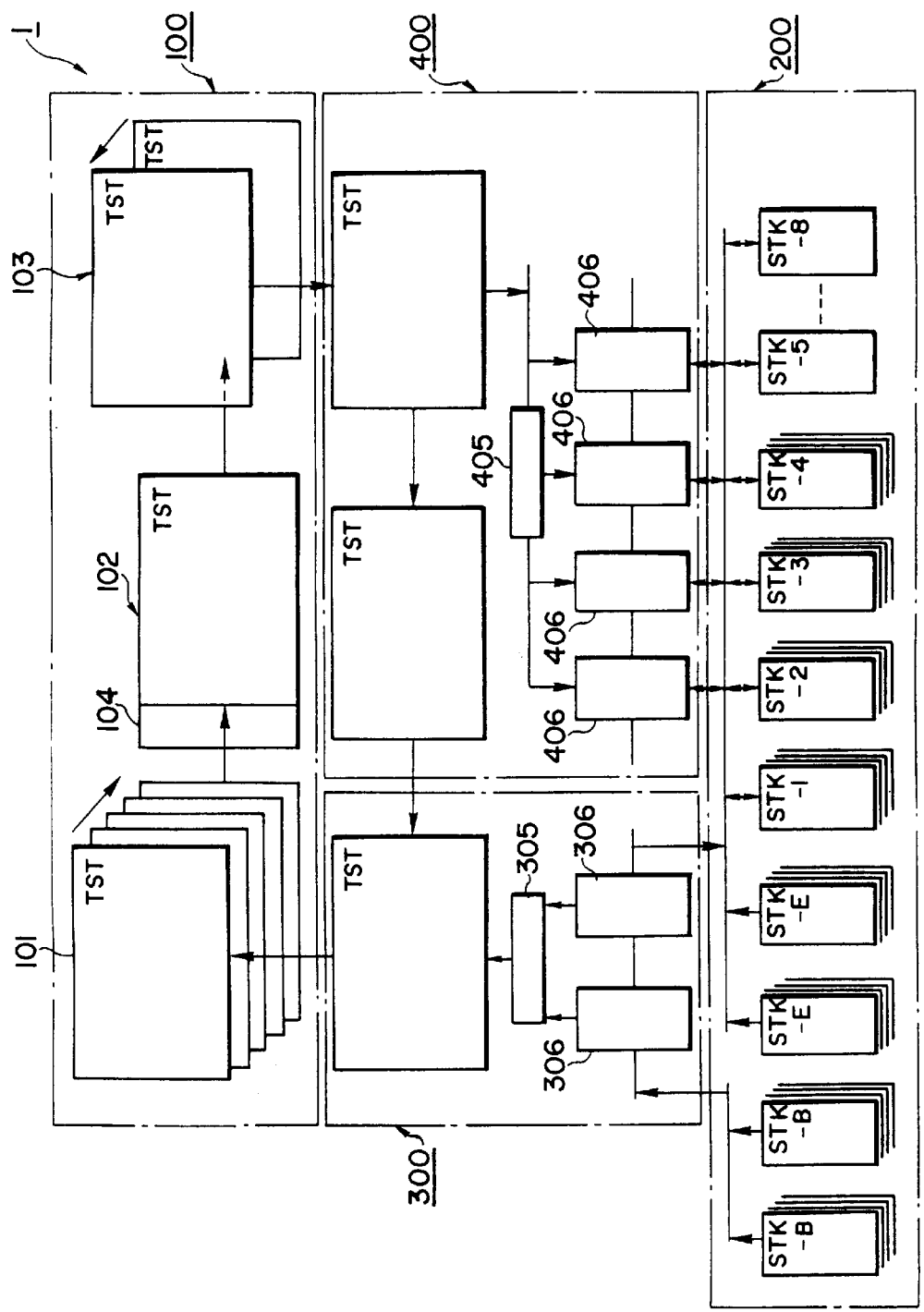
FIG. 2 is a conceptual view of a tray handling method in the IC testing apparatus shown in FIG. 1.

FIG. 1 is a partially cutaway perspective view of an IC testing apparatus, while FIG. 2 is a conceptual view of the tray handling method. Note that FIG. 2 is a view for explaining the tray handling method in the IC testing apparatus of the present embodiment and shows by a plan view the members actually arranged in the vertical direction. Therefore, the mechanical (three-dimensional) structure will be explained with reference to FIG. 1.

The IC testing apparatus 1 of the present embodiment, as shown in FIG. 1 and FIG. 2, is comprised of a chamber section 100 including a test head, an IC magazine 200 storing DUTs to be tested from now or classifies and stores tested DUTs, a loader section 300 for supplying DUTs to the chamber section 100, and an unloader section 400 for classifying and taking out tested DUTs tested at the chamber section 100.

Chamber Section 100

The IC testing apparatus 1 tests (inspects) whether the IC is operating suitably in a state applying a high temperature or low temperature thermal stress to the IC and classifies the ICs in accordance with the test results. The operating test in the state with thermal stress applied is performed by reloading the DUTs from a tray carrying a large number of DUTs to be tested (hereinafter also called the "customer tray KT") to a test tray TST conveyed through the inside of the IC testing apparatus 1.

The test tray TST is loaded with DUTs at the loader section 300, then sent into the chamber section 100 where the DUTs are tested in the chamber section 100 in a state loaded on the test tray TST. Next, the tested DUTs are carried out to the unloader section 400, then the DUTs are reloaded at the unloader section 400 to customer trays KST in accordance with the test results.

The chamber section 100 is comprised of a constant temperature chamber 100 for giving a desired high temperature or low temperature thermal stress to the DUTs loaded on the test tray TST, a test chamber 102 for bringing the DUTs into contact with a test head in a state with the thermal stress given in the constant temperature chamber 101, and a soaking chamber 103 for removing the thermal stress given from the DUTs tested in the test chamber 102.

The soaking chamber 103 cool the DUTs to room temperature by blowing in air when a high temperature has been applied at the constant temperature chamber 101 or heats the DUTs by hot air or a heater etc. to return them to a temperature where condensation will not occur when a low temperature of for example −30° C. has been applied at the constant temperature chamber 101. The thus treated DUTs are then conveyed out to the unloader section 400.

As shown in FIG. 1, the constant temperature chamber 101 and the soaking chamber 103 of the chamber section 100 are arranged to project upward from the test chamber 102. Here, the test tray TST is loaded with DUTs at the loader section 300 and then conveyed into the constant temperature chamber 101. The constant temperature chamber 101 is provided with a vertical conveyor. This vertical conveyor stands by in a state supporting a plurality of test trays TST until the test chamber 102 becomes empty. While standing by, a high temperature or low temperature thermal stress is applied to the DUTs.

The test chamber 102 has a test head 104 arranged at its center. The test tray TST is conveyed over the test head 104 and the DUTs are brought into electrical contact with the test head 104 for testing. The test tray TST after the testing is treated in the soaking chamber 103 where the ICs are return to room temperature and then ejected to the unloader section 400.

Further, a board 105 is inserted as shown in FIG. 1 in the space above the constant temperature chamber 101 and the soaking chamber 103. A test tray conveyor 108 is mounted on this board 105. The test tray TST ejected from the soaking chamber 103 is returned by this test tray conveyor 108 provided above the board 105 through the unloader section 400 and the loader section 300 to the constant temperature chamber 101.

Figure 3:
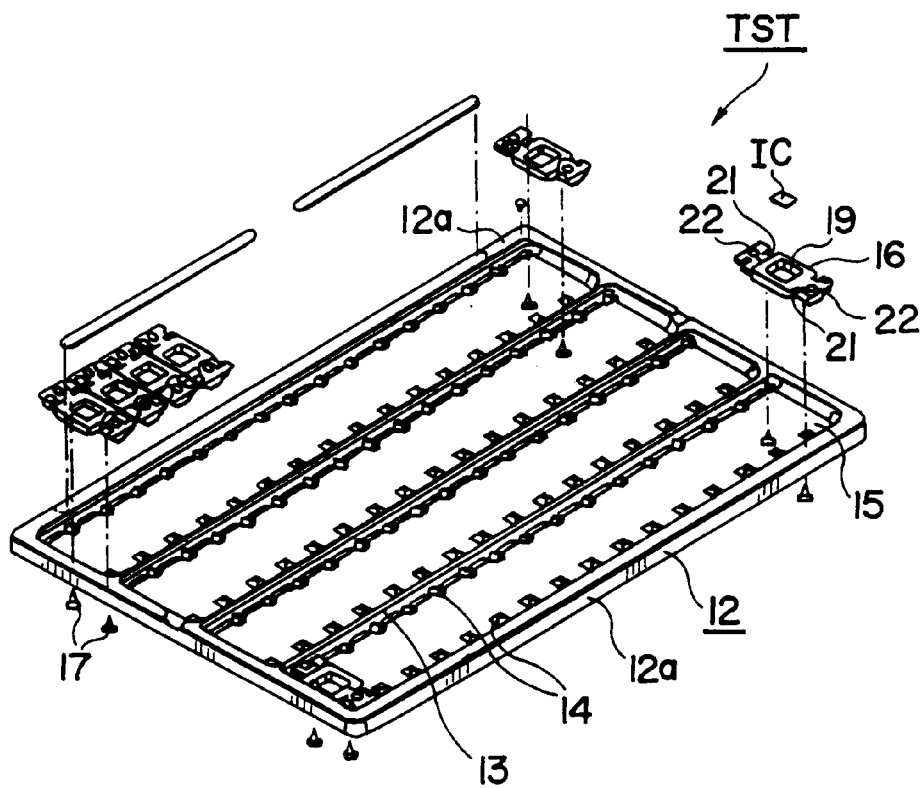
FIG. 3 is a partially disassembled perspective view of a test tray used in the IC testing apparatus shown in FIG. 1.

FIG. 3 is a partially disassembled perspective view of the structure of a test tray TST used in the present embodiment. This test tray TST is comprised of a rectangular frame 12 provided with a plurality of crosspieces 13 in parallel at equal intervals and has a plurality of mounting pieces 14 formed projecting out at equal intervals at the two sides of these crosspieces and the sides 12a of the frame 12 facing the crosspieces. Carrier holders 15 are comprised between these crosspieces 13, between the crosspieces 13 and the sides 12a, and the two mounting pieces 15.

The carrier holders 15 are designed to receive one IC carrier 16 each. An IC carrier 16 is attached to the two mounting pieces 14 in a floating state using fasteners 17. Therefore, mounting holes 21 to the mounting pieces 14 and positioning pin insertion holes 22 are formed at the two ends of the IC carriers 16. For example, about 16×4 of these IC carriers 16 are provided in one test tray TST.

Note that the IC carriers 16 are made the same shape and same dimensions and that the DUTs are received in the IC carriers. The IC holder 19 of the IC carrier 16 is determined by the shape of the DUT to be received and in the example shown in FIG. 3 is made a rectangular indentation.

Figure 4:
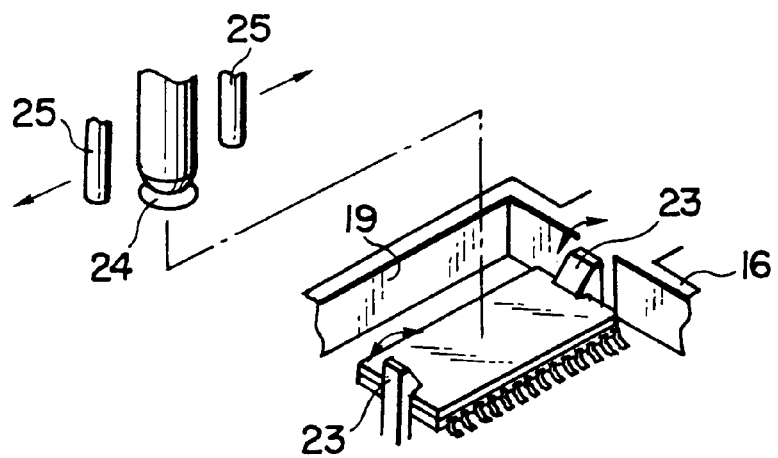
FIG. 4 is a perspective view for explaining the state of loading a DUT in the test tray shown in FIG. 3.

Further, the IC carrier 16 is provided with for example the latches 23 as shown in FIG. 4 for preventing the DUT held in the IC carrier 16 from deviating in position or jumping out. The latches 23 are formed integrally with the IC holder 19 and extend upward from the bottom thereof. Using the elasticity of the plastic material comprising the IC carrier 16, when fitting an IC into the IC holder 19 or taking it out from the IC holder 19, the two latches 23 are spread apart using a latch release mechanism 25 moving together with a suction pad 24 so as to fit or take out the DUT. Further, when the latch release mechanism 25 is moved away from the latches 23, the latches 23 return to their original states due to their elasticity, so the DUT can be held without deviating in position or jumping out.

Figure 5:
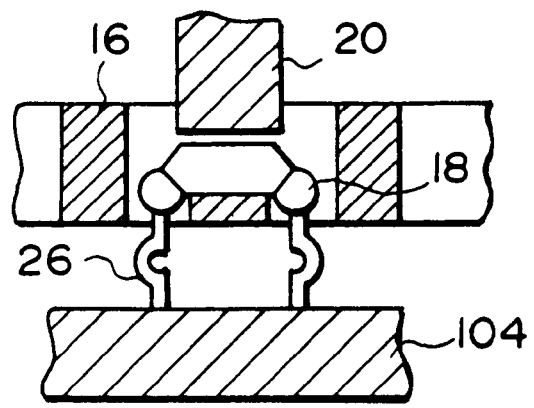
FIG. 5 is a sectional view for explaining the state of electrical contact between a DUT and test head in a test chamber of the IC testing apparatus shown in FIG. 1.

The IC carrier 16, as shown in FIG. 5, holds the DUT so that the terminal pins 18 of the DUT are exposed at the bottom side. The test head 104 pushes the exposed pins 18 of the DUT against the contacts 26 of the IC socket to bring the DUT into electrical contact with the test head 104. Therefore, a pusher 20 for pushing the DUT downward is provided above the test head 104.

Figure 6:
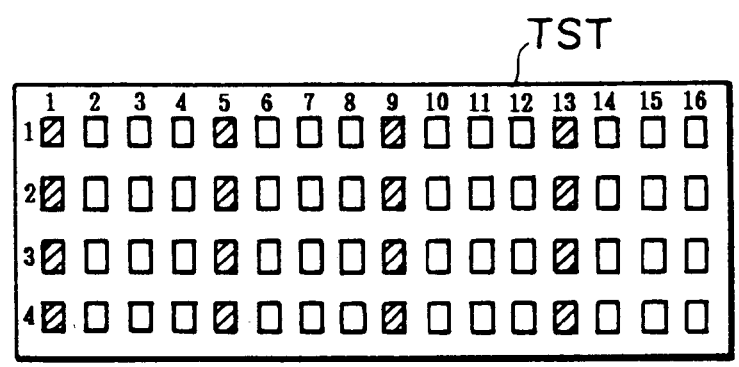
FIG. 6 is a plan view for explaining the test procedure of a DUT in a test chamber of the IC testing apparatus shown in FIG. 1.

Here, if the DUTs once connected to the test head 104 are arranged in four rows and 16 columns as shown in FIG. 6, then for example four rows every four columns of DUTs (portion shown by hatching) are simultaneously tested. That is, in the first test, the 16 DUTs arranged in columns 1, 5, 9, and 13 are connected to the test head 104 for testing and in the second test, the test tray TST is moved one columns worth and the DUTs arranged in column 2, 6, 10, and 14 similarly tested. By doing this a total of four times, all of the DUTs are tested. The results of the test are stored at addresses determined by for example the identification number assigned to the test tray TST and the numbers of the DUTs assigned inside the test tray TST. Note that the present invention is not limited to the method of testing by this procedure. The test may also be performed by another procedure.

IC Magazine 200

The IC magazine 200 is provided with a pre-test IC stocker 201 for holding DUTs to be tested and a post-test IC stocker 202 for holding DUTs classified in accordance with the test results.

Figure 7:
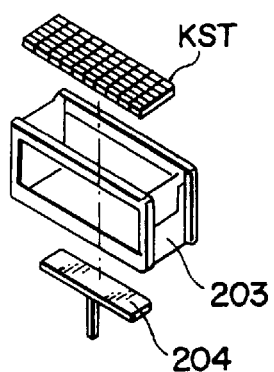
FIG. 7 is a perspective view of the structure of an IC stocker of the IC testing apparatus shown in FIG. 1.
Figure 8:
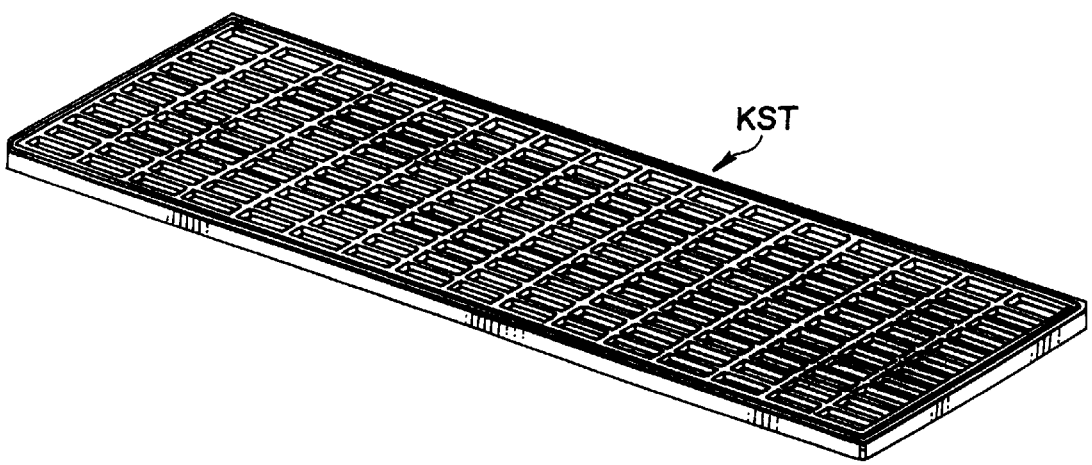
FIG. 8 is a perspective view of a customer tray used in the IC testing apparatus shown in FIG. 1.

These pre-test IC stocker 201 and post-test IC stocker 202, as shown in FIG. 7, are each comprised of a frame-shaped tray support frame 203 and an elevator 204 able to enter from under the tray support frame 203 and move toward the top. The tray support frame 203 supports in it a plurality of stacked customer trays KST as shown in the enlarged view of FIG. 8. The stacked customer trays KST are moved up and down by the elevator 204.

The pre-test IC stocker 201 holds stacked customer trays KST on which the DUTs to be tested are held, while the post-test IC stocker 202 holds stacked customer trays KST on which DUTs finished being tested are suitably classified.

Note that since the pre-test IC stocker 201 and the post-test IC stocker 202 are structured the same, the numbers of the pre-test IC stocker 201 and the post-test IC stocker 202 may be suitably set in accordance with need. In the example shown in FIG. 1 and FIG. 2, for the pre-test stockers 201, there are provided two stockers STK-B and provided next to that two empty stockers STK-E to be sent to the unloader section 400, while for the post-test IC stockers 102, there are provided eight stockers STK-1, STK-2, . . . , STK-8 which can hold ICs sorted into a maximum of eight classes according to the test results. That is, in addition to classifying ICs as good and defective, it is possible to divide the good ICs into ones with high operating speeds, ones with medium speeds, and ones with low speeds and the defective ICs into ones requiring retesting etc.

Loader Section 300

The above-mentioned customer tray KST is conveyed to the loader section 200. In the loader section 300, the DUTs loaded on the customer tray KST are reloaded to a test tray TST stopped at the loader section 300.

As the IC conveyor for reloading the DUTs from a customer tray KST to a test tray TST, as shown in FIG. 1, use is made of an X-Y conveyor 304 provided with two rails 301 laid above the board 105, a movable arm 302 able to move back and forth (this direction designated as the Y-direction) between a test tray TST and customer tray KST by the two rails 301, and a movable head 303 supported by the movable arm 302 and able to move in the X-direction along the movable arm 302.

The movable head 303 of the X-Y conveyor 304 has suction heads attached facing downward. The suction heads move while drawing out air to pick up the DUTs from the customer tray KST and reload the DUTs on the test tray TST. For example, about eight suction heads are provided on the movable head 303, so it is possible to reload eight DUTs at one time on the test tray TST.

Note that in a general customer tray KST, indentations for holding the DUTs are formed relatively larger than the shapes of the DUTs, so the positions of the DUTs in a state held on a customer tray KST can vary largely. Therefore, if DUTs are picked up by the suction heads and conveyed directly to the test tray TST in this state, it becomes difficult for the ICs to be dropped accurately into the IC receiving indentations formed in the test tray TST.

Therefore, in the IC testing apparatus 1 of the present embodiment, an IC position correcting means called a preciser 305 is provided between the set position of the customer tray KST and the test tray TST. This preciser 305 has relatively deep indentations surrounded with inclined surfaces at their circumferential edges, so when DUTs picked up by the suction heads are dropped into these indentations, the drop positions of the DUTs are corrected by the inclined surfaces. Due to this, the positions of the eight DUTs with respect to each other are accurately set and it is possible to pick up the correctly positioned DUTs by the suction heads once again and reload them on the test tray TST and thereby reload the DUTs precisely in the IC receiving indentations formed in the test tray TST.

Figure 10:
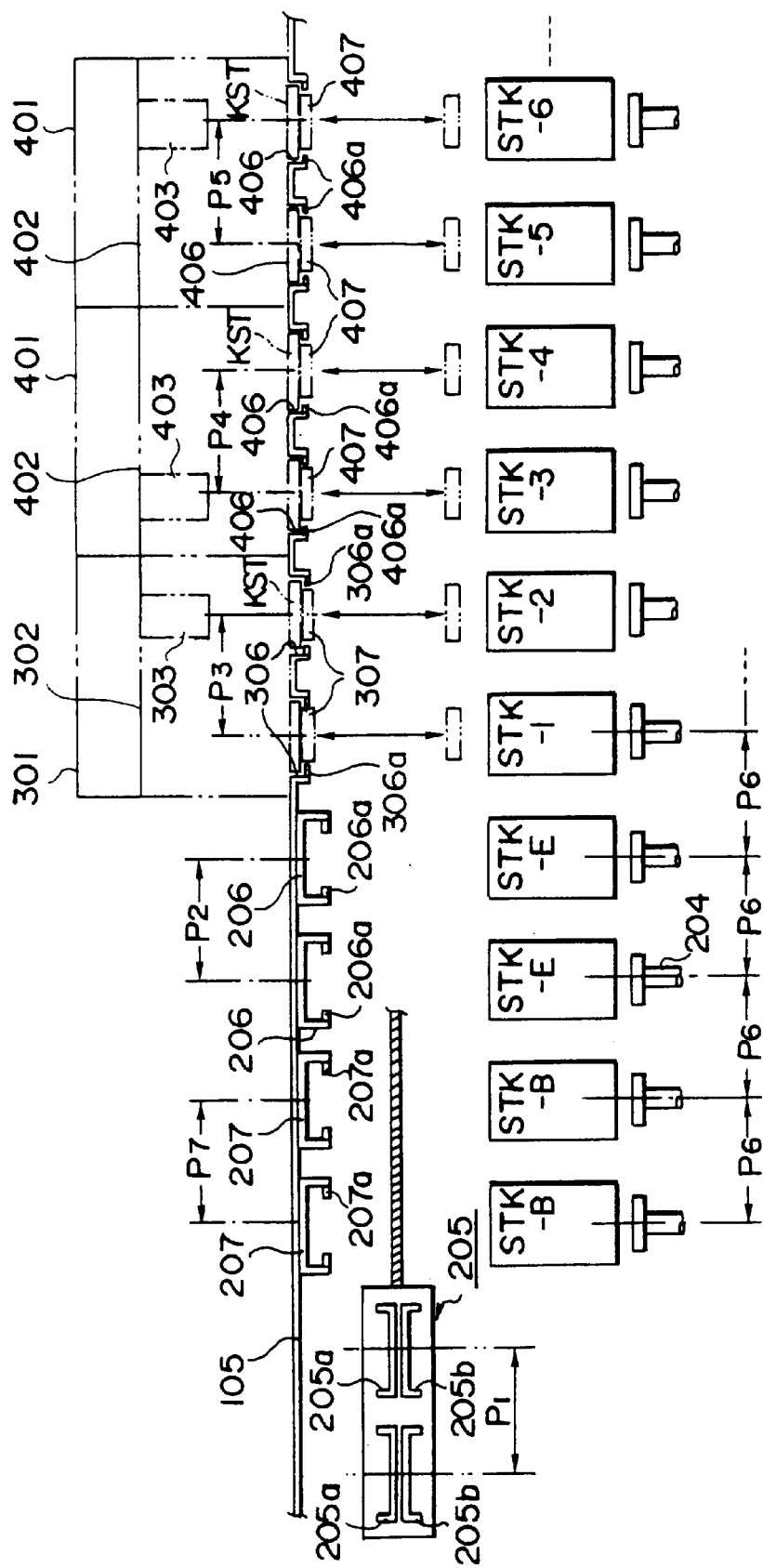
FIG. 10 is a sectional view along the line XX—XX of FIG. 1.

FIG. 10 is a sectional view along the line XX-XX of FIG. 1 and shows by a longitudinal section the board 105, later explained tray transfer arm 205, and IC magazine 200. As shown in the figure, the board 105 of the loader section 300 is provided with a pair of windows 306, 306 arranged so that the customer trays KST carried to the loader section 300 can approach the top surface of the board 105. Further, each of the windows 306 is provided with holding hooks 306a for holding the customer tray KST carried to the window 306. The customer tray KST is held at a position where the top surface of the customer tray KST is positioned near to the surface of the board 105 through the window 306.

At the lower sides of the windows 306 are provided elevator tables 307 for raising and lowering the customer trays KST. Each descends carrying a customer tray KST from which the DUTs to be tested have been unloaded and which has therefore become empty and transfers the empty tray to a lower side tray holder of the tray transfer arm 205.

Unloader Section 400

The unloader section 400 is provided with X-Y conveyors 404, 404 of the same structure as the X-Y conveyor 304 provided at the loader section 300. The X-Y conveyors 404, 404 reload the tested DUTs from the test tray TST carried out to the unloader section 400 to the customer tray KST.

As shown by the longitudinal sectional view of the board 105, the tray transfer arm 205, and the IC magazine 200 of FIG. 10, the board 105 of the unloader section 400 is provided with two pairs of windows 406, 406 arranged so that the customer trays KST carried to the unloader section 400 can be brought close to the top surface of the board 105. Further, each of the windows 406 is provided with holding hooks 406a for holding the customer tray KST carried to the window 406. The customer tray KST is held at a position where the top surface of the customer tray KST is positioned near to the surface of the board 105 through the window 406. The specific configuration of the holding hooks 406a is not particularly limited. For example, they may mechanically grip the customer tray KST or using a suction means to hold the customer tray KST.

At the lower sides of the windows 406 are provided elevator tables 407 for raising and lowering the customer trays KST. Each descends carrying a customer tray KST becoming full after being loaded with tested DUTs and transfers the full tray to a lower side tray holder of the tray transfer arm 205. Note that instead of the elevator tables 407, it is also possible to use elevators 204 of stockers STK positioned directly under the windows 406 to elevate and lower the customer trays KST.

Note that in the IC testing apparatus 1 of the present embodiment, while there are a maximum of eight types of sortable categories, it is only possible to arrange a maximum of four customer trays KST at the windows 406 of the unloader section 400. Therefore, there is a limit of four sortable categories in real time. In general, four categories are sufficient, i.e., good ICs can be classified into high speed response devices, medium speed response devices, and low speed response devices plus defective devices, but there may also arise categories not belonging to these categories such as devices requiring retesting.

In this way, when DUTs arise which are classified into a different category than the categories given to four customer trays arranged at the windows 406 of the unloader section 400, one customer tray KST may be returned from the unloader section 400 to the IC magazine 200 and a customer tray KST to hold DUTs of the newly arising category may be transferred to the unloader section 400 in its place so as to hold these DUTs. If customer trays KST are switched in the middle of sorting work, the sorting work has to be interrupted during that time and therefore there is the problem of a reduction in the throughput. Therefore, in the IC testing apparatus 1 of the present embodiment, a buffer section 405 is provided between the test tray TST and the window 406 of the unloader section 400, and DUTs of a category rarely appearing are deposited temporarily at this buffer section 405.

For example, the buffer section 405 is given a capacity able to hold 20 to 30 or so DUTs. A memory is provided for storing the category of ICs held at the IC holding locations of the buffer section 405. The categories and positions of the DUTs temporarily deposited at the buffer section 405 are stored for each DUT. In the intervals of the sorting work or when the buffer section 405 has become full, customer trays KST of the categories to which the DUTs stored at the buffer section 405 belong are called up from the IC magazine 200 and the DUTs received on these customer trays KST. At this time, sometimes the DUTs temporarily deposited at the buffer section 405 span several categories, but at this time it is sufficient to call up several customer trays KST at one time from the windows 406 of the unloader section 400 when calling up customer trays KST.

Tray Transfer Arm 205

As shown in FIG. 1, a tray transfer arm 205 moving across the entire range of the directions of arrangement of the pretest IC stockers 201 and the post-test IC stockers 202 is provided in the space with the board 105 above the pre-test IC stockers 201 and the post-test IC stockers 202. In this embodiment, since windows 306, 406 of the loader section 300 and unloader section 400 are provided directly above (without deviation in the Y-direction) the pre-test IC stockers 201 and post-test IC stockers 202, the tray transfer arm 205 can also move in only the X- and Z-directions. Note that depending on the positional relationship of the IC magazine 200 and the loader section 300 or unloader section 400, the tray transfer arm 205 may also be able to move in all directions of the X-, Y-, and Z-directions.

The tray transfer arm 205 is provided with a pair of tray holders 205a, 205a for holding the customer trays KST arranged vertically and transfer the customer trays KST between the loader section 300 and unloader section 400 and the pre-test IC stockers 201 and post-test IC stockers 202.

Figure 9:
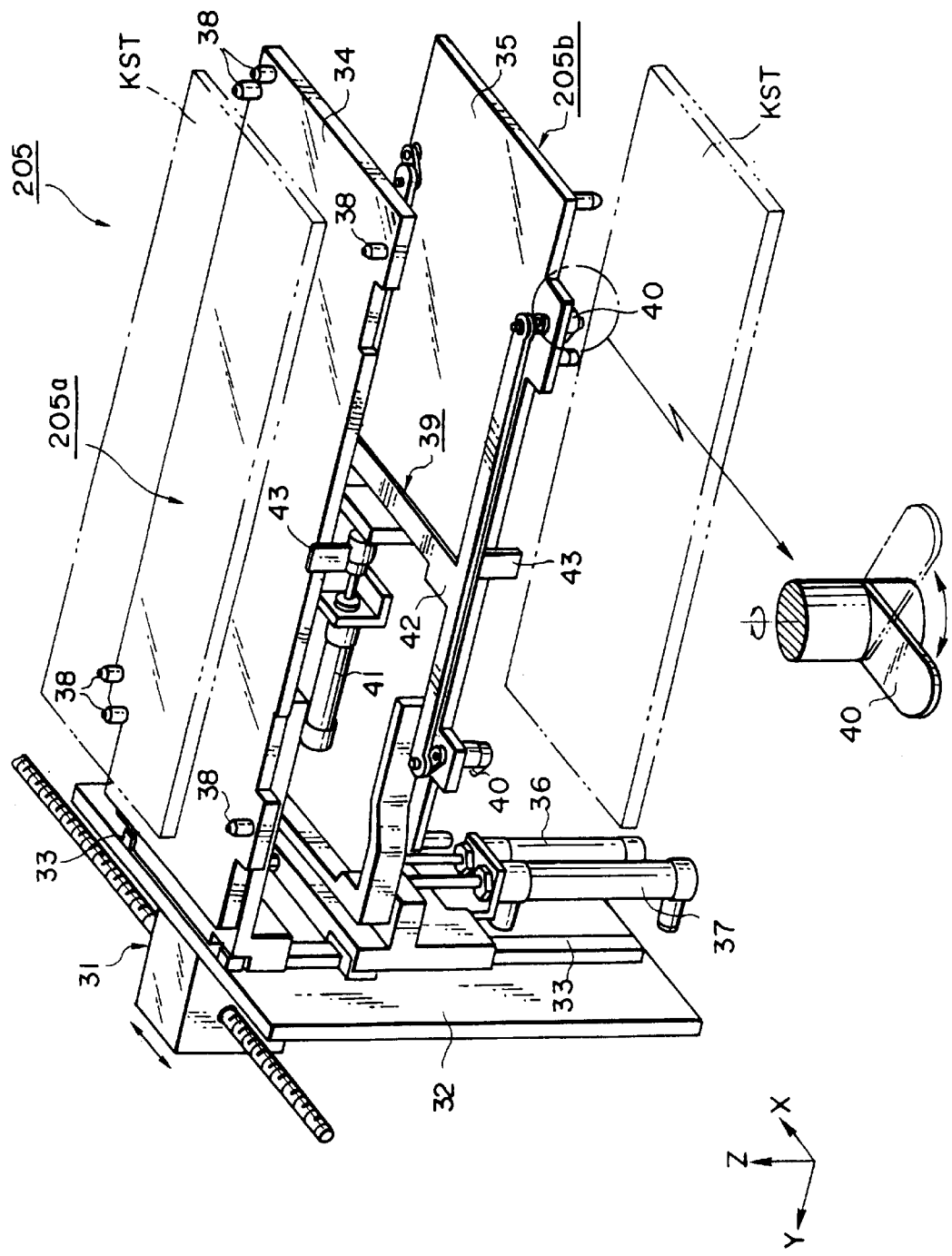
FIG. 9 is a perspective view showing a tray transfer arm used in the IC testing apparatus shown in FIG. 1.

FIG. 9 is a perspective view of a specific embodiment of the tray transfer arm 205. The arm is provided with a base plate 32 which moves in the X-direction by a ball screw 31 operating extending in the X-direction. A main surface of the base plate 32 is provided with two tray holding plates 34, 35 through a linear guide 33 extending in the Z-direction.

The tray holding plate 34 positioned at the upper side has fixed to it a rod of a first fluid pressure cylinder 36 fixed to the base plate 32. By operation of the first fluid pressure cylinder 36, the tray holding plate 34 moves in the Z-direction along the linear guide 33. On the other hand, the tray holding plate 35 positioned at the lower side has fixed to it a rod of a second fluid pressure cylinder 37 fixed to the base plate 32. By operation of the second fluid pressure cylinder 37, the tray holding plate 35 moves in the Z-direction along the linear guide.

The upper surface of the tray holding plate 34 positioned at the upper side is provided at suitable locations with guide pins 38 for guiding the peripheral edges of the customer tray KST. The customer tray KST can be held along the guide pins 38.

As opposed to this, the tray holding plate 35 of the lower side holds the customer tray KST at the lower surface, so a holding hook mechanism 39 is provided so that the customer tray KST will not fall off. The holding hook mechanism 39 is comprised for example as shown in the figure so that the hooks 40 arranged at locations corresponding to the four corners of the customer tray KST are opened and closed by a link mechanism 42 operating by the fluid pressure cylinder 41. That is, when holding the customer tray KST, the hooks 40 are opened, the customer tray KST inserted, and then in that state the hooks 40 closed so as to have the customer tray KST held by the tray holding plate 35. Similarly, when releasing the customer tray KST, it is moved to the desired position while the hooks 40 are kept closed and then the hooks 40 opened to release the customer tray KST.

Note that each of the upper side tray holding plate 34 and lower side tray holding plate 35 is provided with a proximity sensor 43 for detecting the existence of a customer tray KST. The detection signal of the proximity sensor 43 is transmitted to a not shown control apparatus. Further, the control for the rotational drive of the ball screw 31 and the control of the first and second fluid pressure cylinders 36, 37 and fluid pressure cylinder 41 of the holding hook mechanism 39 are executed by the same not shown control apparatus.

In the example shown in FIG. 9, each base plate 32 is provided with a pair of upper and lower tray holding plates 34, 35, but as shown in FIG. 1 it is also possible to arrange another pair of tray holding plates 34, 35 in the X-direction and transfer two customer trays KST by each of the upper and lower tray holding plates 34, 35 at one time. In this case, as shown in FIG. 10, it is desirable to equally set as the same all of the pitch P1 of the pair of the tray holders, the pitch P2 of the later explained tray setting apparatuses 206, the pitches P3, P4, and P5 of the windows 306, 406 of the loader section 300 and unloader section 400, and the pitch P6 of the stockers STK of the IC magazine 200.

On the other hand, an empty customer tray KST to be transferred to the unloader section 400 is supplied from the empty tray stocker STK-E in the IC magazine 200. To set the empty tray stored in the empty tray stocker STK-E in the upper side tray holder 205a of the tray transfer arm 205, as shown in FIG. 1 and FIG. 10, a tray setting apparatus 206 is provided.

This tray setting apparatus 206 holds an empty tray when an empty tray rises from the empty tray stocker STK-E positioned directly beneath it by the elevator 204. The holding hooks 206a are designed to close when holding an empty tray and open when releasing it.

Note that in this embodiment, the tray setting apparatus 206 was arranged directly above the empty tray stocker STK-E, but the invention is not particularly limited to this and other positions are also possible. In this case, however, since an empty tray cannot be transferred to the tray setting apparatus 206 from the empty tray stocker STK-E by just the elevator 204, it is necessary to provide a separate means for moving the empty tray in the X- or Y-direction. Further, the function of the tray setting apparatus 206 may be handled by the windows 306, 406 of the loader section 300 or unloader section 400.

Note that in this embodiment, the upper side tray holding plate 34 and the lower side tray holding plate 35 were fixed to the base plate 32 and one ball screw 31 was used to move the two tray holding plates 34, 35 together, but the tray transfer arm 205 of the present invention is not limited to just this. The upper side tray holding plate 34 and the lower side tray holding plate 35 may also be made to move independently by separate ball screws.

Next, the operation will be explained.

FIG. 11 to FIG. 20 are sectional views corresponding to FIG. 10 showing the series of operations in the pair of windows 406 of the unloader section 400 (only one shown) for ejecting a full customer tray KST to a stocker of the IC magazine 200 and setting an empty customer tray KST to the window 406.

Figure 11:
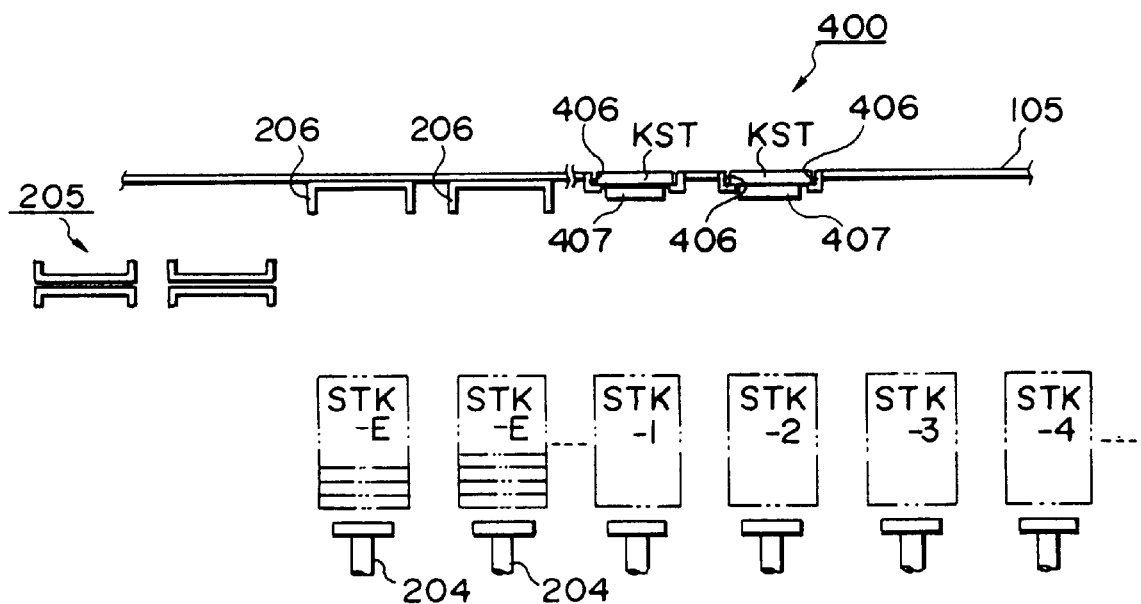
FIG. 11 is a sectional view corresponding to FIG. 10 for explaining a tray handling method in a first embodiment of the present invention.

FIG. 11 shows the step of setting an empty customer tray KST to a window 406 of the unloader section 400 and reloading tested DUTs from a test tray TST conveyed out to the unloader section 400. At this time, the holding hooks 406a provided at the window 406 are closed.

When a customer tray KST set in the window 406 of the unloader section 400 becomes full, the customer tray KST is transferred to the stocker STK-1 to 8 of the corresponding category and an empty customer tray KST is set from the empty tray stocker STK-E to the window 406 of the unloader section 400. This procedure is shown below.

Note that in the following example, the present invention is explained giving as an example the case where both of the customer trays KST set in the two windows 406 of the unloader section 400 become full, but the same operation may be performed using just one of the tray holders of the tray transfer arm 205 when one of the customer trays KST becomes full.

Figure 12:
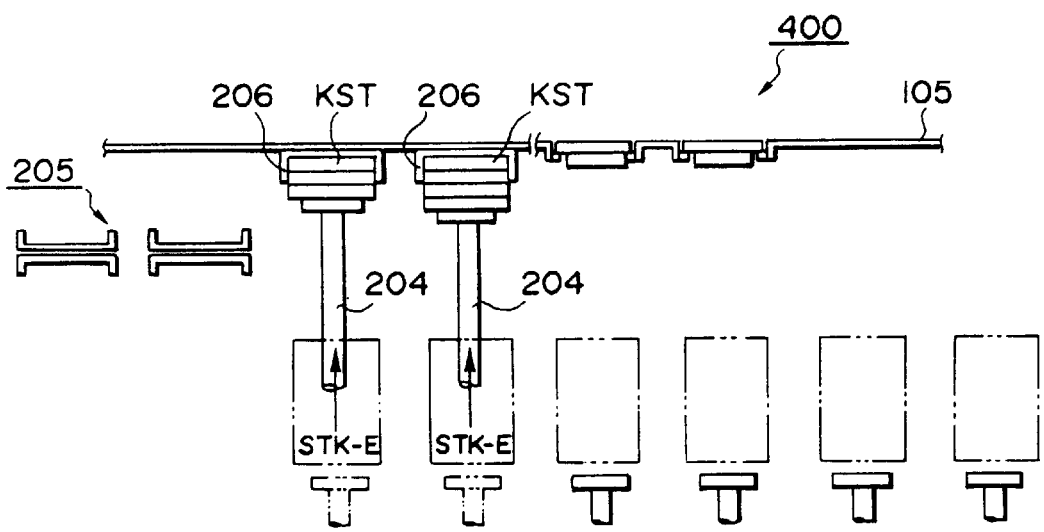
FIG. 12 is a sectional view corresponding to FIG. 10 for explaining a tray handling method in a first embodiment of the present invention.

First, as shown in FIG. 12, before the customer tray KST set in the window 406 of the unloader section 400 becomes full, the elevator 204 of the empty tray stocker STK-E is made to rise and the stacked empty customer trays KST are made to rise to the tray setting apparatus 206. At this time, the holding hooks 206a of the tray setting apparatus 206 first open then close after the customer tray KST is set to the tray setting apparatus 206 by the elevator 204. Due to this, even if the elevator 204 descends, it is possible to hold the empty customer tray KST.

Figure 13:
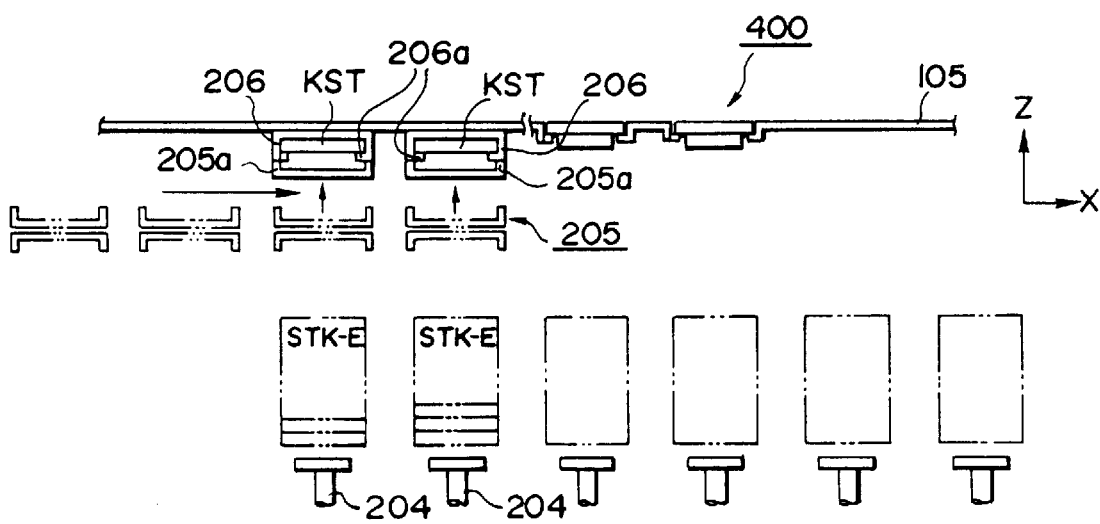
FIG. 13 is a sectional view corresponding to FIG. 10 for explaining a tray handling method in a first embodiment of the present invention.

After an empty customer tray KST is set to the tray setting apparatus 206, as shown in FIG. 13, the tray transfer arm 205 is moved in the X-direction to arrive directly under the tray setting apparatus 206. At that position, the first fluid pressure cylinder 36 is operated to make the upper side tray holder 205a rise. The holding hooks 206a of the tray setting apparatus 206 are then opened to reset the empty customer tray KST in the upper side tray holder 205a of the tray transfer arm 205. After the empty customer tray KST is reset in the upper side tray holder 205a, the first fluid pressure cylinder 36 is again operated to make the upper side tray holder 205a descend to its original position.

Figure 14:
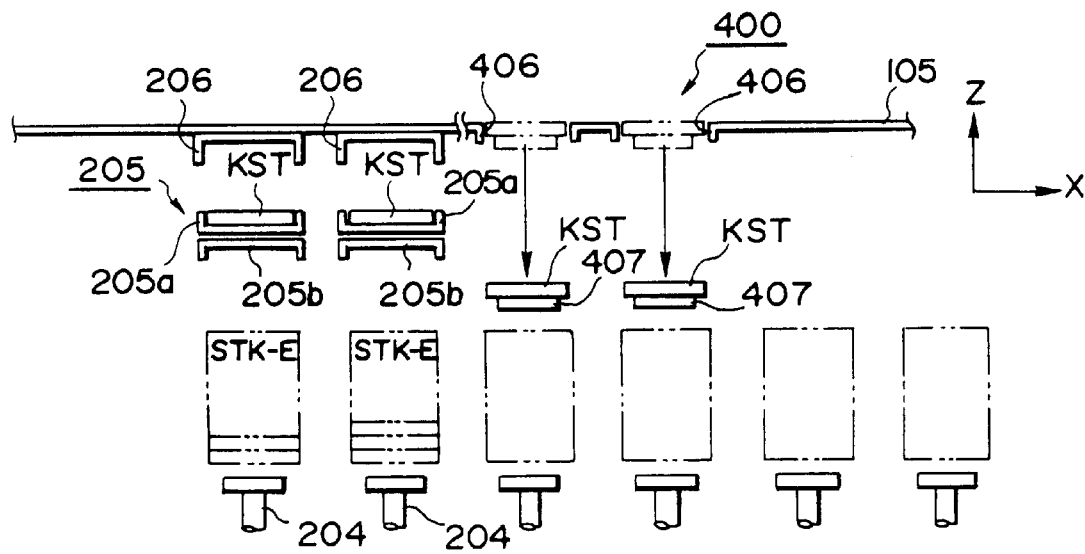
FIG. 14 is a sectional view corresponding to FIG. 10 for explaining a tray handling method in a first embodiment of the present invention.

In this state, when the customer tray KST set in the window 406 of the unloader section 400 becomes full, as shown in FIG. 14, first the holding hooks 406a of the window 406 are opened and the elevator 407 is made to descend to make the full customer tray KST descend in the Z-direction to a position below the tray transfer arm 205.

Figure 15:
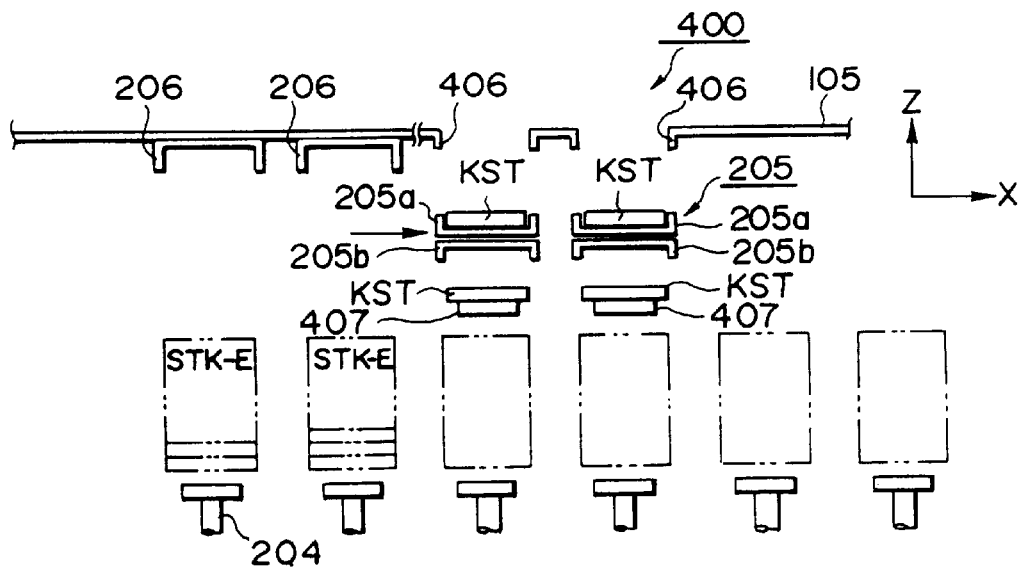
FIG. 15 is a sectional view corresponding to FIG. 10 for explaining a tray handling method in a first embodiment of the present invention.
Figure 16:
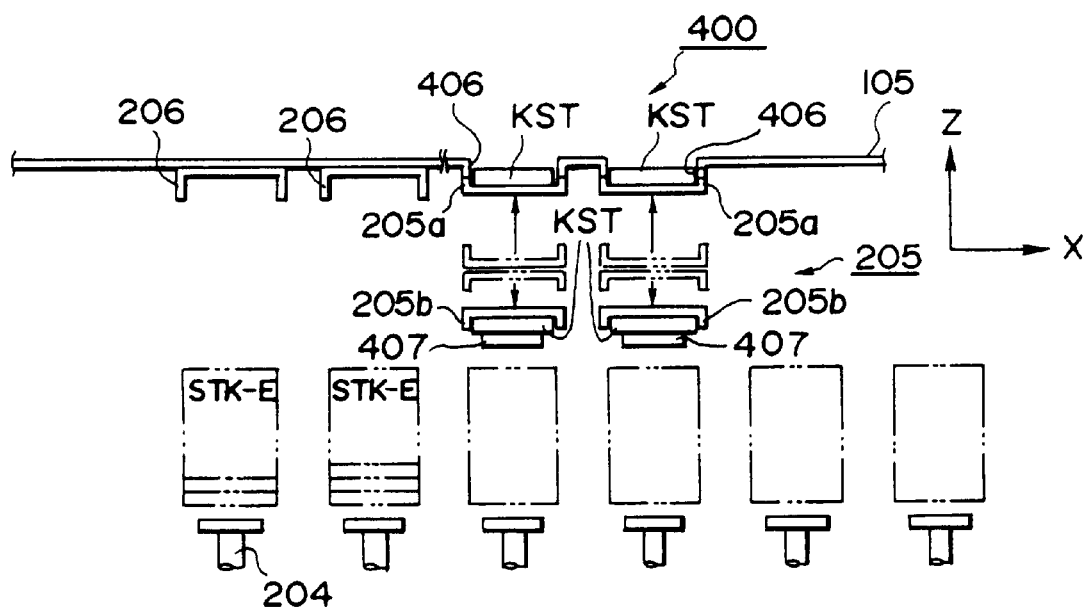
FIG. 16 is a sectional view corresponding to FIG. 10 for explaining a tray handling method in a first embodiment of the present invention.

Further, as shown in FIG. 15, the tray transfer arm 205 is made to move in the X-direction to the position directly above the elevator table 407. In that position, as shown in FIG. 16, the upper side tray holder 205a is made to rise to the window 406 of the unloader section 400 and the lower side tray holder 205b is made to descend to the elevator table 407. The upper side tray holder 205a is made to rise by operating the first fluid pressure cylinder 36, while the lower side tray holder 205b is made to descend by operating the second fluid pressure cylinder 37.

By closing the holding hooks 406a provided at the window 406 of the unloader section 400, the upper side tray holder 205a holds the empty customer tray KST conveyed there. Further, by closing the hooks 40 provided at the lower side tray holder 205b, the full customer tray KST carried on the elevator table 407 is held at the lower side tray holder 205b.

Figure 17:
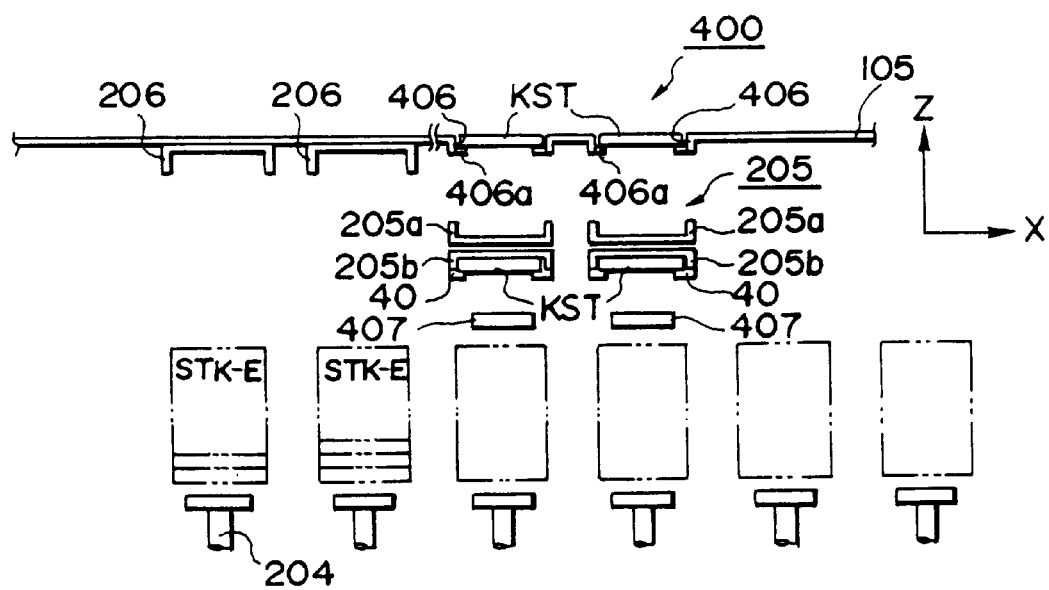
FIG. 17 is a sectional view corresponding to FIG. 10 for explaining a tray handling method in a first embodiment of the present invention.

This state is shown in FIG. 17. Since an empty customer tray KST is set at the window 406 of the unloader section 400, it is possible to reload the next DUT from the test tray TST later.

Figure 18:
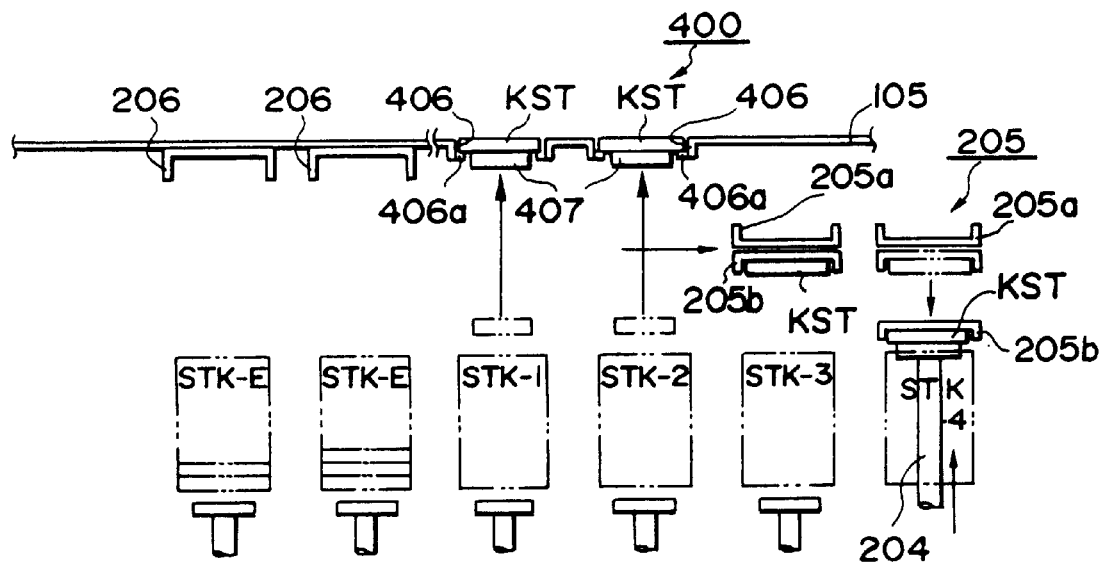
FIG. 18 is a sectional view corresponding to FIG. 10 for explaining a tray handling method in a first embodiment of the present invention.

The tray transfer arm 205 holding the two full customer trays KST moves to the post-test IC stockers 202 (STK-1 to 8) of the categories assigned to these customer trays KST and stores the customer trays KST there. That is, assuming that the customer tray KST held at the right side of the tray transfer arm shown in FIG. 17 belongs to the category STK-4 among the post-test IC stockers 202, while the customer tray KST held at the left side belongs to the category STK-2, as shown in FIG. 18, the tray transfer arm 205 is moved in the X-direction until the right side tray holder 205b is positioned directly above the post-test IC stocker STK-4. At that position, only the lower side tray holder 205b of the tray transfer arm 205 at the right side is made to descend in the Z-direction.

Figure 20:
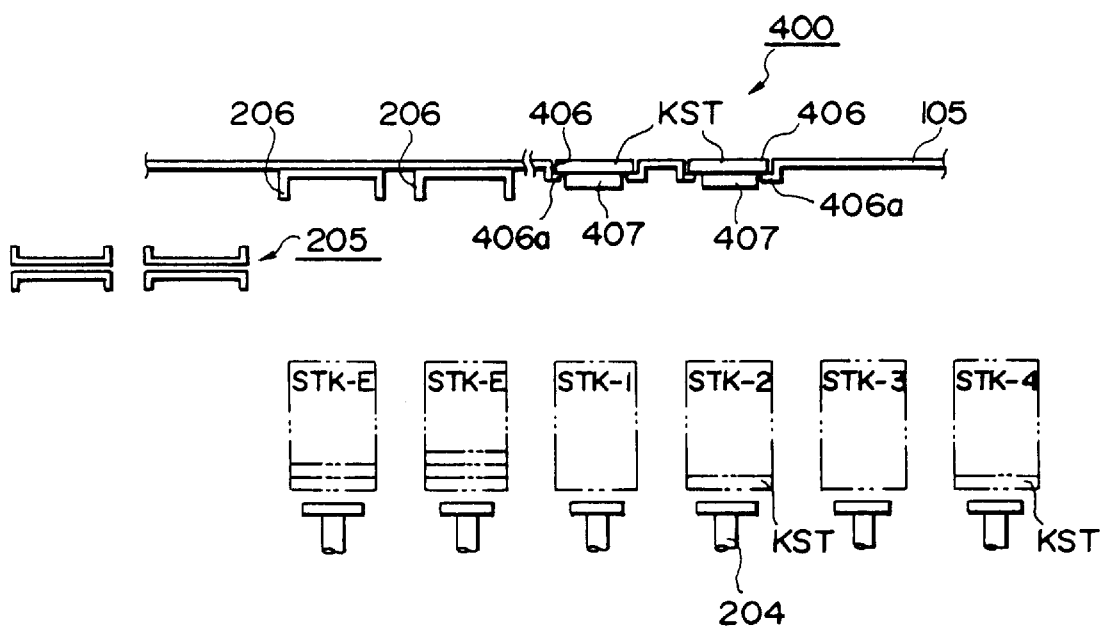
FIG. 20 is a sectional view corresponding to FIG. 10 for explaining a tray handling method in a first embodiment of the present invention.

At the same time as this, the elevator 204 of the post-test IC stocker STK-4 is made to rise to pick up a full customer tray KST. When the elevator 204 reaches the lower side tray holder 205b, the hooks 40 of the tray holder 205b open and the customer tray KST is reset on the elevator 204. By making the elevator 204 descend to the original position, as shown in FIG. 20, the customer tray KST full with the DUTs can be stored in the stocker STK-4 assigned to it. Note that during this time, the elevator table 407 is made to rise to the window 406 of the unloader section 400.

Figure 19:
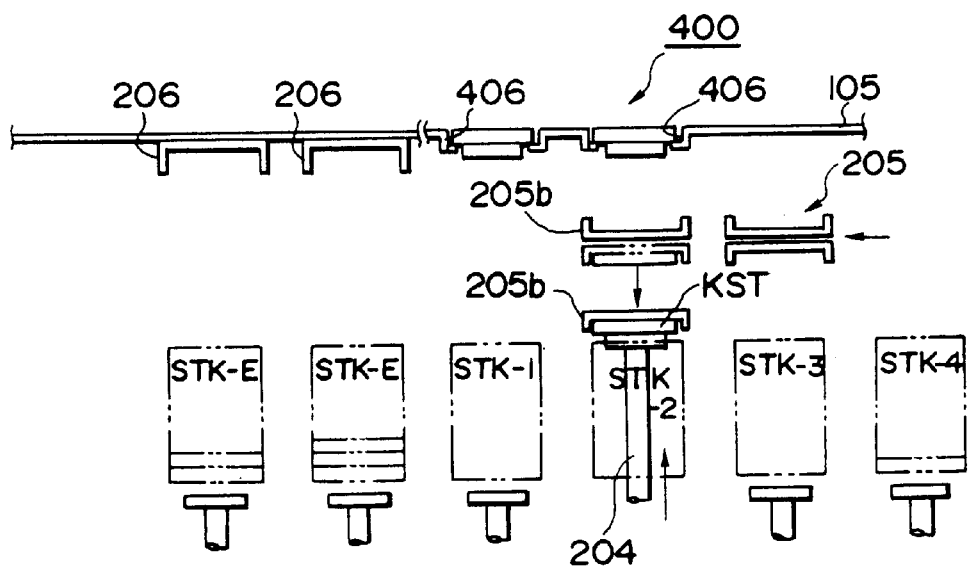
FIG. 19 is a sectional view corresponding to FIG. 10 for explaining a tray handling method in a first embodiment of the present invention.

In the same way as this, to store the customer tray KST held by the tray transfer arm 205 at the left side in the stocker STK-2, as shown in FIG. 19, the tray transfer arm 205 is made to move in the X-direction until the left side tray holder 205b is positioned directly above the post-test IC stocker STK-2. At that position, only the lower side tray holder 205b of the tray transfer arm 205 at the left side is made to descend in the Z-direction. At the same time as this, the elevator 204 of the post-test IC stocker STK-2 is made to rise to pick up a full customer tray KST. When the elevator 204 reaches the lower side tray holder 205b, the hooks 40 of the tray holder 205b opens and the customer tray KST is reset on the elevator 204. By making the elevator 204 descend to its original position, as shown in FIG. 20, the customer tray KST full with the DUTs can be stored in the stocker STK-2 assigned to it.

In this way, according to the IC testing apparatus 1 of this embodiment, when exchanging a full customer tray KST and empty customer tray KST at the unloader section 400, as shown in FIG. 16, the tray transfer arm 205 can simultaneously receive the full tray and deliver an empty tray at that position without movement, so the exchange process becomes shorter by that amount and the speed of exchanging trays is raised. Further, since the empty tray is set in the unloader section 400 before the exchange process, that is, at the step shown in FIG. 16, even if the transfer of the full tray remains, the work of reloading DUTs from the test tray at the unloader section 400 can be stored and therefore the throughput of the IC testing apparatus is improved.

Further, since the pitch P1 of the two pairs of the tray holders 205 is set equal to the pitch P2 of the tray setting pi apparatuses 206, the pitches P3, P4, and P5 of the windows 306, 406 of the loader section 300 and unloader section 400, and the pitch P6 of the stockers STK of the IC magazine 200, it is possible to make the two customer trays KST move simultaneously at the same position and thereby raise the speed of exchange.

Second Embodiment

There are various methods of use of the tray holders 205a and 205b of the tray transfer arm 205 used in the IC testing apparatus of the present invention.

In the first embodiment, the tray transfer arm was used for exchanging a customer tray KST becoming full at the unloader section 400 with an empty customer tray KST, but it is also possible to temporarily deposit one of the four customer trays KST arranged in the unloader section 400 and during that time set a customer tray KST of another category in the unloader section 400 for reloading with DUTs, then again set the customer tray KST temporarily deposited at the tray transfer arm 205 in the unloader section 400 for reloading with the next DUTs.

That is, as explained above, when there are DUTs of categories other than the categories assigned to the four customer trays KST arranged at the windows 406 of the unloader section 400, one customer tray KST may be returned from the unloader section 400 to the IC magazine 200 and a customer tray KST to store the DUTs of the newly arising category may be transferred to the unloader section 400 in its place to store the DUTs, but if customer trays KST are switched in the middle of sorting work, there is the problem that it is necessary to interrupt the sorting work during that time and therefore the throughput falls. Therefore, in the IC testing apparatus 1 of this embodiment, a buffer section 405 is provided between the test tray TST and window 406 of the unloader section 400 and DUTs of categories seldom occurring are temporarily deposited in the buffer section 405.

Separately from or together with this, it is possible to adopt the tray handling method shown in FIG. 21 to FIG. 28. The IC testing apparatus 1 used is the same as that of the first embodiment, so a detailed explanation will be omitted.

Figure 21:
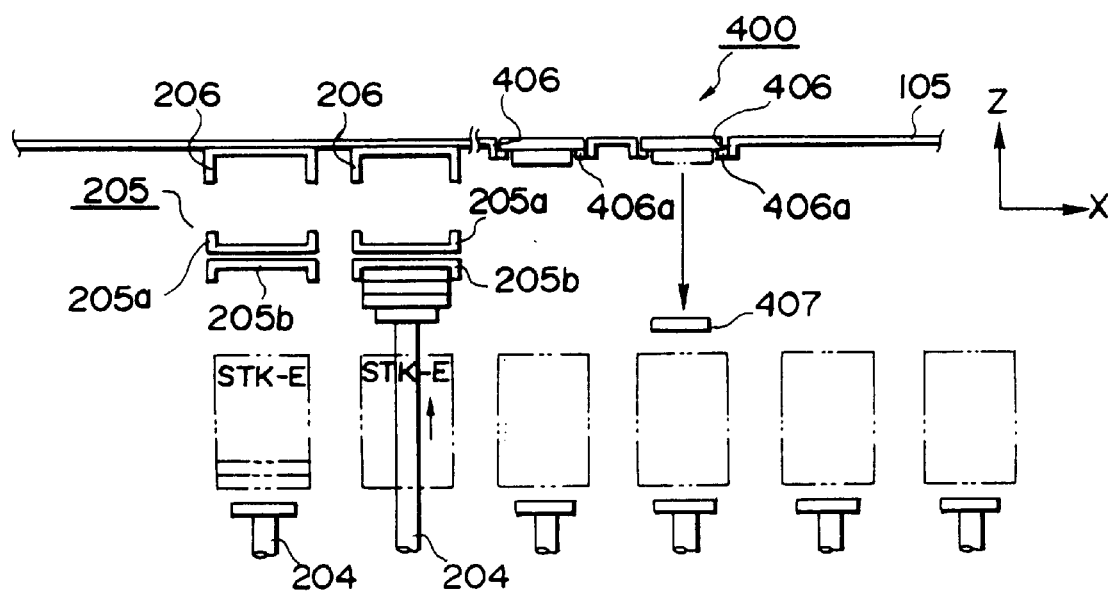
FIG. 21 is a sectional view corresponding to FIG. 10 for explaining a tray handling method in a first embodiment of the present invention.

First, FIG. 21 is a sectional view (corresponding to FIG. 10) showing the state of reloading a tested IC from the test tray TST to a customer tray KST in one unloader section 400. The explanation will be given of the case of temporarily ejecting the right side customer tray KST and conveying an empty customer tray KST as another tray to the right side window 406.

First, as shown in FIG. 21, the right side elevator table 407 of the unloader section 400 is made to descend, the elevator 204 of the empty tray stocker STK-E is made to rise, and an empty tray KST is transferred to the lower tray holder 205b of the right side of the tray transfer arm 205 (left side also possible). The customer tray KST set in the right side window 406 of the unloader section 400 is held by closing the holding hooks 406a. Further, when the empty tray KST is transferred to the lower side tray holder 205b of the tray transfer arm 205, the empty tray KST is held by closing the hooks 40.

Figure 22:
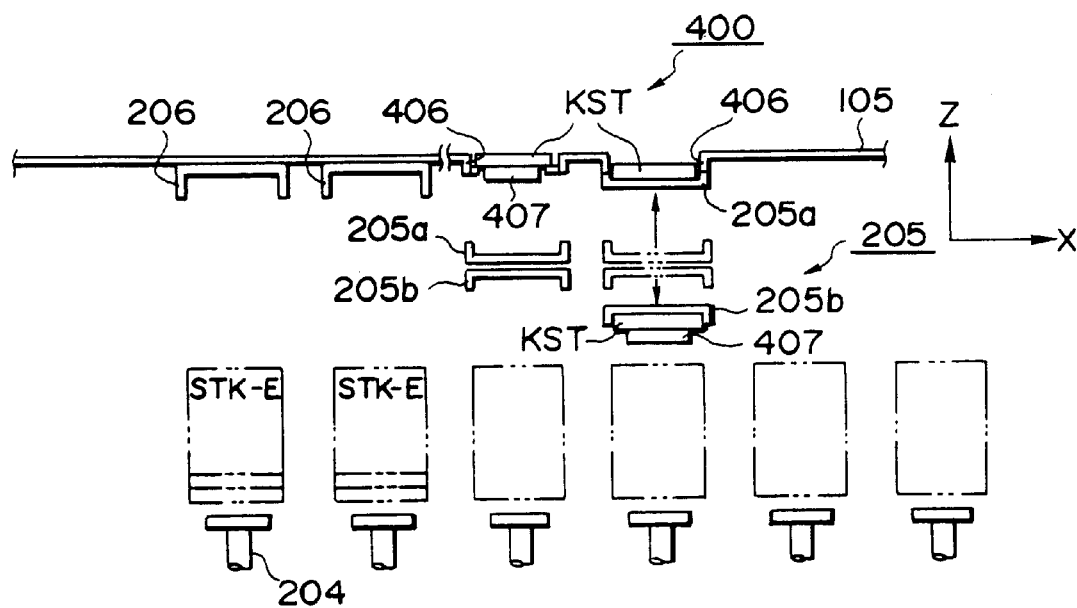
FIG. 22 is a sectional view corresponding to FIG. 10 for explaining a tray handling method in a second embodiment of the present invention.

Next, as shown in FIG. 22, the tray transfer arm 205 is made to move in the X-direction until it is positioned directly beneath the unloader section 400. There, the lower side tray holder 205b is made to descend to transfer to the elevator table 407 the empty tray KST held in the lower side tray holder 205b. When the lower side tray holder 205b approaches the elevator table 407, the hooks 40 of the lower tray holder open and the empty tray KST is placed on the elevator table 407.

At the same time as this or around the same, the upper side tray holder 205a is made to rise to pick up the customer tray KST held in the window 406 of the unloader section 400. That is, when the upper side tray holder 205a approaches the window 406 and the customer tray KST is placed in the tray holder 205a, the holding hooks 406a are opened, the customer tray KST is released, and the customer tray KST is transferred to the tray holder 205a.

Figure 23:
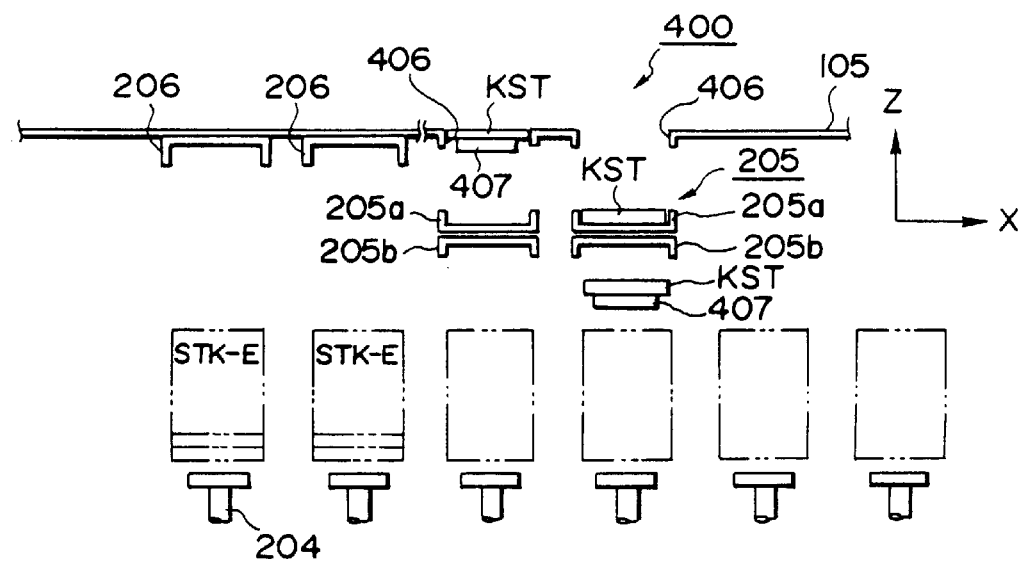
FIG. 23 is a sectional view corresponding to FIG. 10 for explaining a tray handling method in a second embodiment of the present invention.

Next, as shown in FIG. 23, the upper side tray holder 205a is made to descend to the original position and the lower side tray holder 205b is made to rise to the original position. Due to this, the customer tray KST is transferred from the window 406 of the unloader section 400 to the upper side tray holder 205a and the empty tray KST is transferred from the lower tray holder 205b to the elevator table 407.

Figure 24:
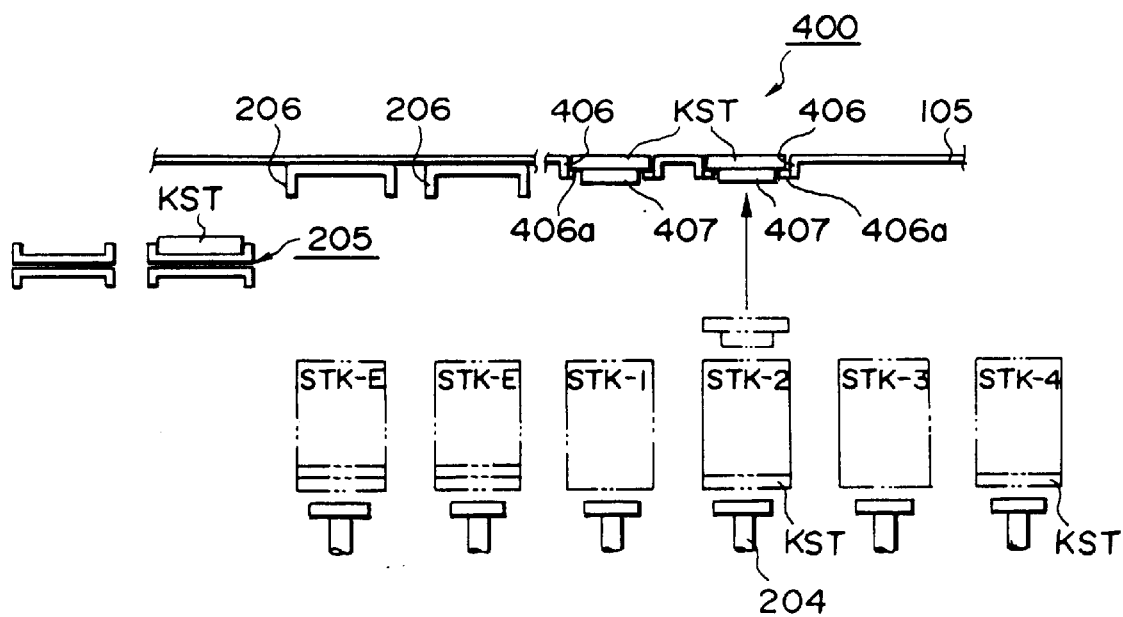
FIG. 24 is a sectional view corresponding to FIG. 10 for explaining a tray handling method in a second embodiment of the present invention.

Further, as shown in FIG. 24, the tray transfer arm 205 is made to move in the X-direction to retract from that position once, then the elevator table 407 is made to rise to the window 406 and the holding hooks 406a are closed to set the empty tray KST to the window 406 of the unloader section 400. In the state shown in this figure, the DUTs of the category assigned to the empty KST are reloaded on that empty tray KST. Note that the retracted position of the tray transfer arm 205 in this state is not limited to the original position illustrated in any way. Other positions are also possible.

Figure 25:
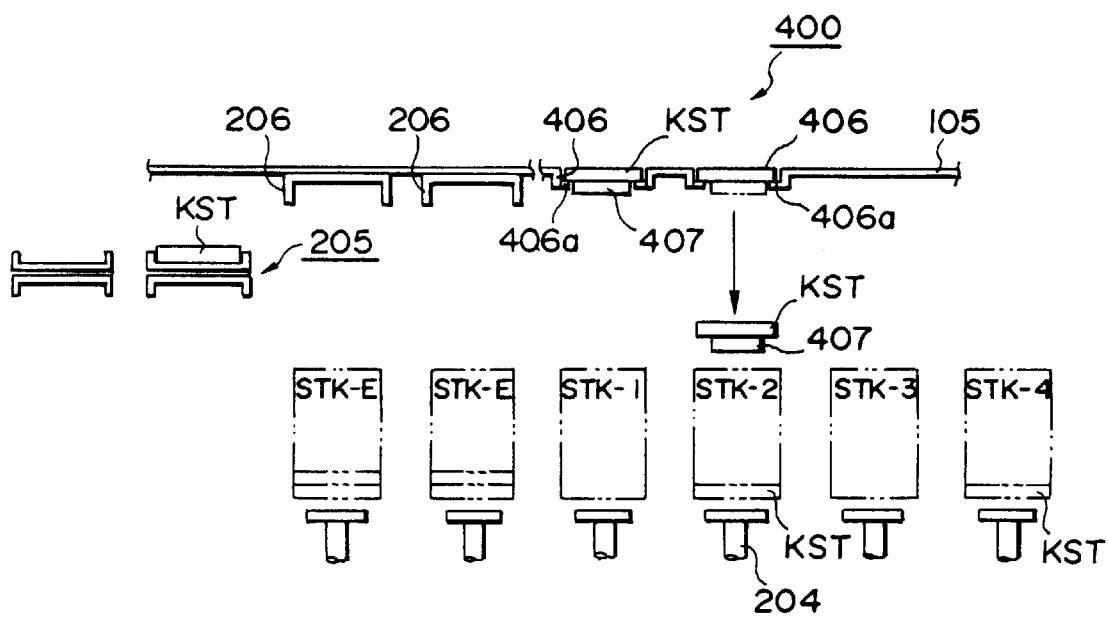
FIG. 25 is a sectional view corresponding to FIG. 10 for explaining a tray handling method in a second embodiment of the present invention.

After the reloading work ends, the customer tray KST in the middle of the work temporarily deposited in the tray transfer arm 205 is returned to the original window 406. That is, as shown in FIG. 25, the holding hooks 406a of the unloader section 400 are opened to release the customer tray KST, then the elevator table 407 is made to descend.

Figure 26:
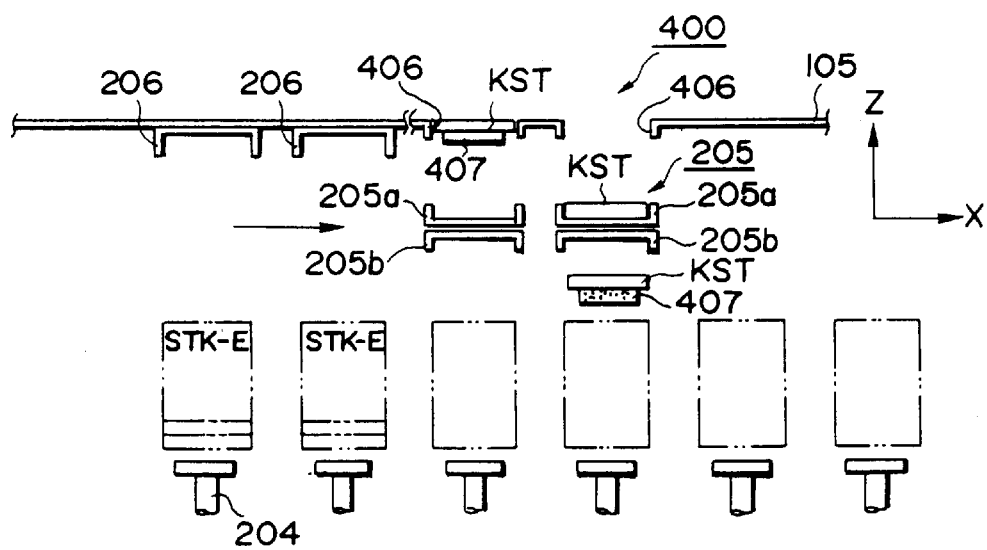
FIG. 26 is a sectional view corresponding to FIG. 10 for explaining a tray handling method in a second embodiment of the present invention.
Figure 27:
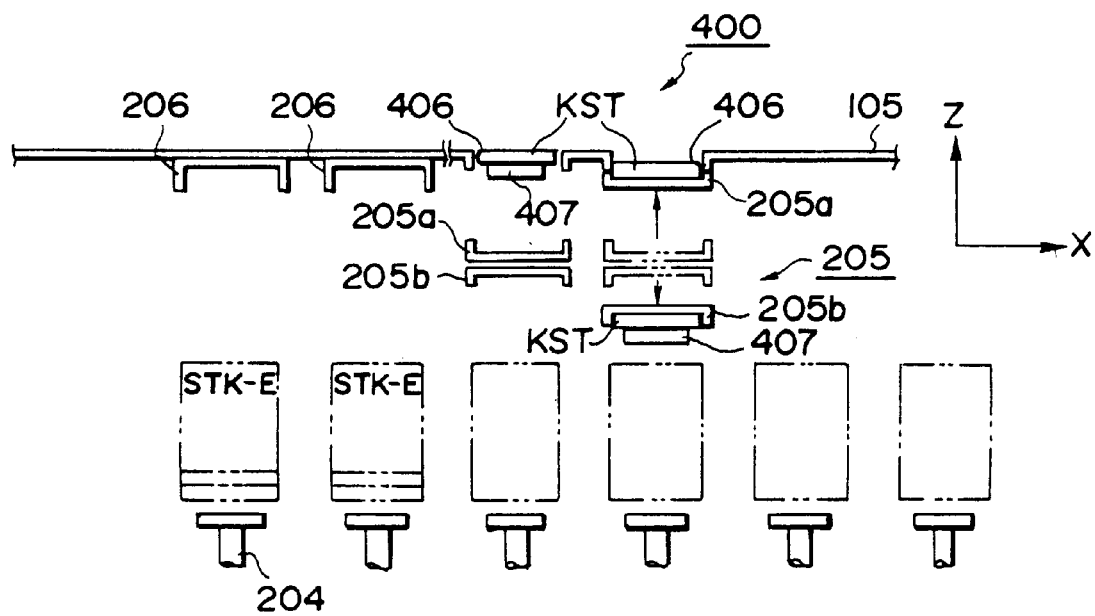
FIG. 27 is a sectional view corresponding to FIG. 10 for explaining a tray handling method in a second embodiment of the present invention.

Next, as shown in FIG. 26, the tray transfer arm 205 is made to move to directly under the unloader section 400. At this position, as shown in FIG. 27, the upper side tray holder 205a is made to rise to transfer the customer tray KST in the middle of work stored at the upper side tray holder 205a to the window 406 of the unloader section 400. When the upper side tray holder 205a approaches the window 406, the holding hooks 406 of the window are closed to hold the customer tray KST.

At the same time as this or around the same, the lower side tray holder 205b is made to descend to pick up the customer tray KST carried on the elevator table 407. That is, when the lower side tray holder 205b approaches the elevator table 407, the hooks 40 are closed to hold the customer tray KST. The upper side tray holder 205a is made to descend to the original position and the lower side tray holder 205b is made to rise to the original position. Due to this, the customer tray KST in the middle of work is transferred to the window 406 of the unloader section and a customer tray KST is transferred to the lower side tray holder 205b.

Figure 28:
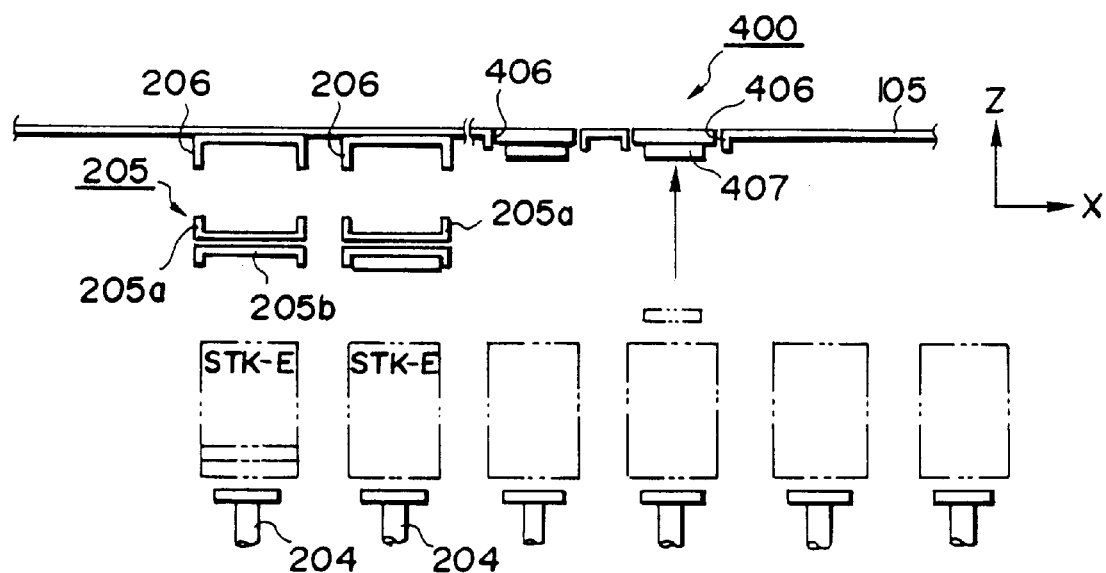
FIG. 28 is a sectional view corresponding to FIG. 10 for explaining a tray handling method in a second embodiment of the present invention.

Further, as shown in FIG. 28, the tray transfer arm 205 is made to move in the X-direction to retract from that position once, then the elevator table 407 is made to rise to the window 406. The customer tray KST held at the lower side tray holder 205b of the tray transfer arm 205 may be conveyed to the stocker STK of the IC magazine 200 for that category or may stand by in the state shown in FIG. 28 for switching of customer trays KST again by the procedure shown in FIG. 21 to FIG. 28 after a DUT appears belonging to that category.

In this way, according to the IC testing apparatus 1 of the present embodiment, since a customer tray KST in the middle of reloading work is deposited once at the tray holder 205a of the tray transfer arm 205 and stands by in that state until the end of reloading on to another customer tray KST, the speed of exchange becomes faster and the throughput is improved compared with conveying that customer tray to the IC magazine each time.

Note that in the present embodiment, the customer tray KST in the middle of work was deposited in the upper side tray holder 205a, but the invention is not limited to this. It is also possible to deposit it in the lower side tray holder 205b.

Third Embodiment

In the above embodiment, the tray transfer arm 205 of the present invention was used for the exchange of customer trays KST at the unloader section 400, but the tray transfer arm 205 of the present invention can also be used for the exchange of customer trays KST at the loader section 300.

The IC testing apparatus 1 used is the same as that of the above first embodiment, so a detailed explanation will be omitted, but in the loader section 300, as shown in FIG. 10, a customer tray KST loaded with DUTs to be tested (here, stored in the stocker STK-B of the IC magazine 200) is conveyed to the window 306 of the loader section 300 where the DUTs are reloaded on the test tray TST, then the now empty customer tray KST is conveyed to the empty tray stocker STK-E of the IC magazine 200.

The tray handling method will be explained next referring to FIG. 29 to FIG. 37.

FIG. 29 to FIG. 37 are sectional views corresponding to FIG. 10 showing the series of operations in the pair of windows 306, 306 of the loader section 300 for ejecting an empty customer tray KST to an empty tray stocker STK-E of the IC magazine 200 and setting a customer tray KST loaded with DUTs to be tested to the windows 306, 306.

Figure 29:
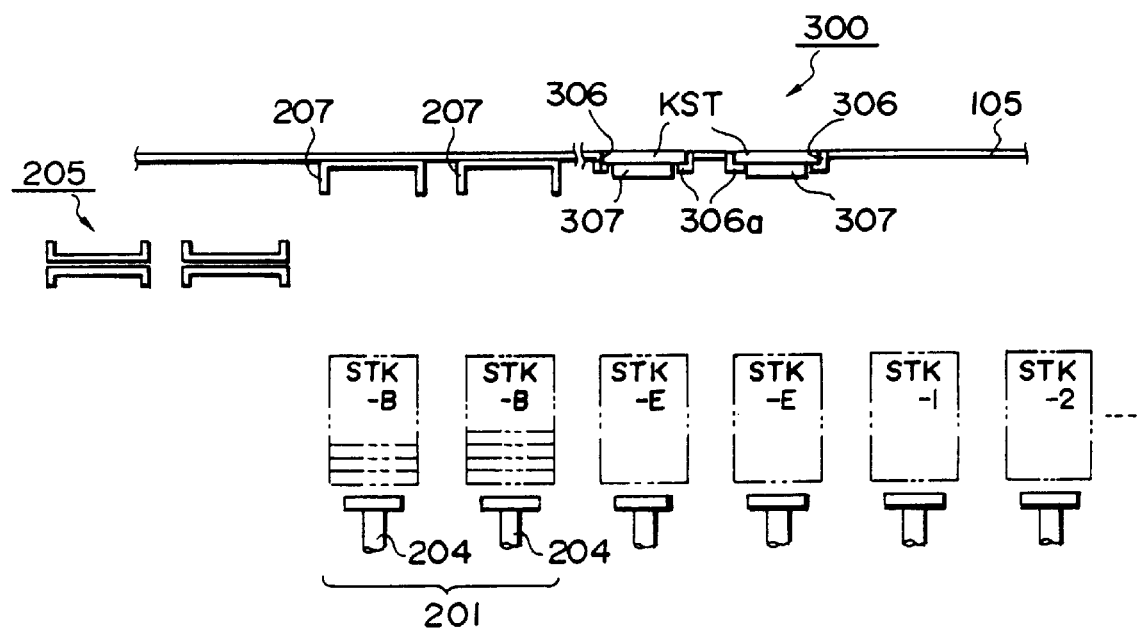
FIG. 29 is a sectional view corresponding to FIG. 10 for explaining a tray handling method in a third embodiment of the present invention.

First, FIG. 29 shows the step of setting customer trays KST fully loaded with DUTs to be tested to windows 306, 306 of the loader section 300 and reloading DUTs-to be tested to test trays TST conveyed to the loader section 300. At this time, the holding hooks 306a provided at the windows 306 are closed.

Note that in the following example, the present invention will be explained taking as an example the case where both of the customer trays KST set at the two windows 306, 306 of the loader section 300 become empty, but the same operation may be performed using only one pair of the tray holders of the tray transfer arm 205 when just one of the customer trays KST becomes empty.

Figure 30:
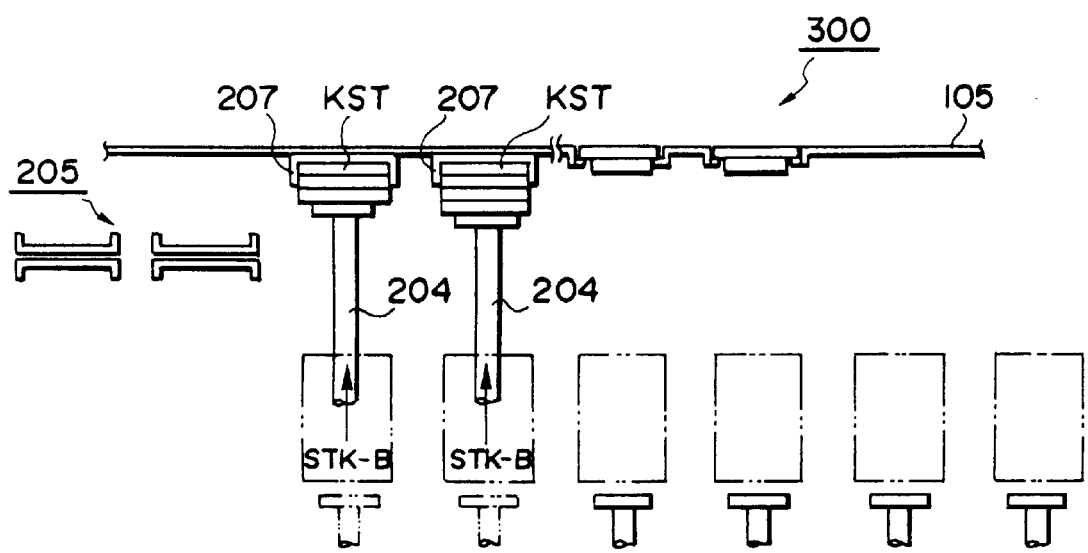
FIG. 30 is a sectional view corresponding to FIG. 10 for explaining a tray handling method in a third embodiment of the present invention.

First, as shown in FIG. 30, before a customer tray KST set at the window 306 of the loader section 300 becomes empty, the elevator 204 of the stocker of the pre-test IC stocker 201 (hereinafter called the STK-B) is made to rise to make the stacked customer trays KST rise to the tray setting apparatus 207. At that time, the holding hooks 207a of the tray setting apparatus 207 first open then close after a customer tray KST is set to the tray setting apparatus 207 by the elevator 204. Due to this, even if the elevator 204 descends, it is possible to hold the customer tray KST full with the DUTs. Note that the tray setting apparatus 207 is configured the same as the tray setting apparatus 206 explained in the first embodiment.

Figure 31:
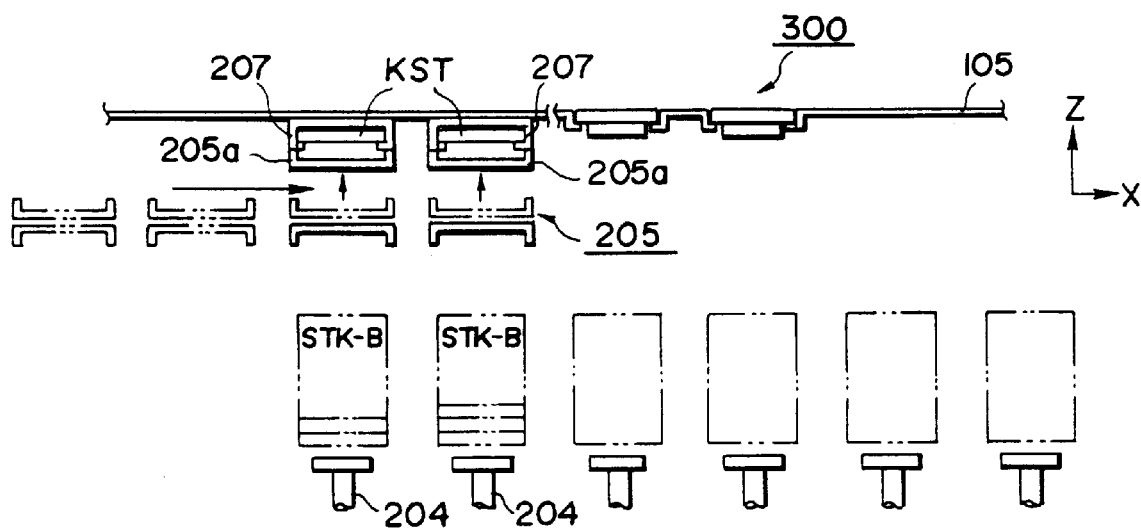
FIG. 31 is a sectional view corresponding to FIG. 10 for explaining a tray handling method in a third embodiment of the present invention.

After a full customer tray KST is set to the tray setting apparatus 207, as shown in FIG. 31, the tray transfer arm 205 is moved in the X-direction to arrive directly under the tray setting apparatus 207. At that position, the first fluid pressure cylinder 36 is operated to make the upper side tray holder 205a rise. The holding hooks 207a of the tray setting apparatus 207 are then opened to reset the full customer tray KST in the upper side tray holder 205a of the tray transfer arm 205. After the full customer tray KST is reset in the upper side tray holder 205a, the first fluid pressure cylinder 36 is again operated to make the upper side tray holder 205a descend to its original position.

Figure 32:
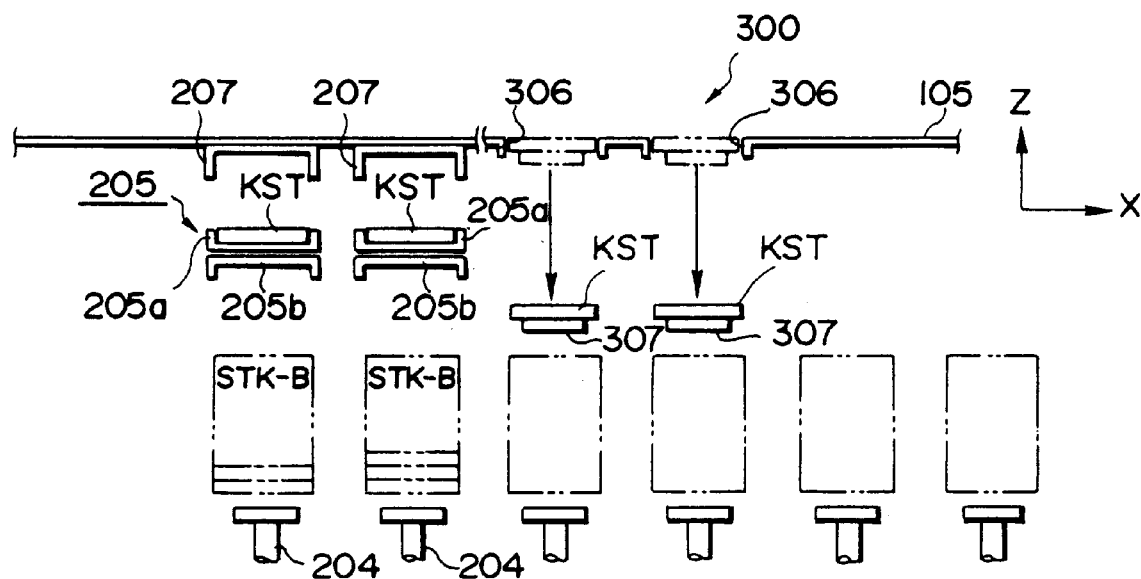
FIG. 32 is a sectional view corresponding to FIG. 10 for explaining a tray handling method in a third embodiment of the present invention.

In this state, when the customer tray KST set in the window 306 of the loader section 300 becomes empty, as shown in FIG. 32, first the holding hooks 306a of the window 306 are opened and the elevator table 307 is made to descend to make the now empty customer tray KST descend in the Z-direction to a position below the tray transfer arm 205.

Figure 33:
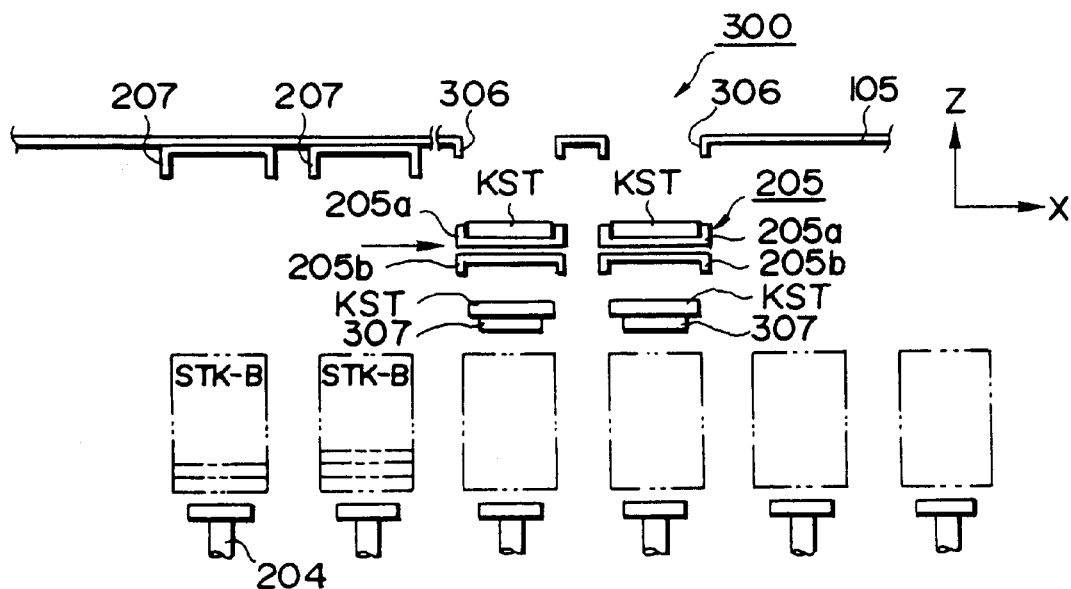
FIG. 33 is a sectional view corresponding to FIG. 10 for explaining a tray handling method in a third embodiment of the present invention.
Figure 34:
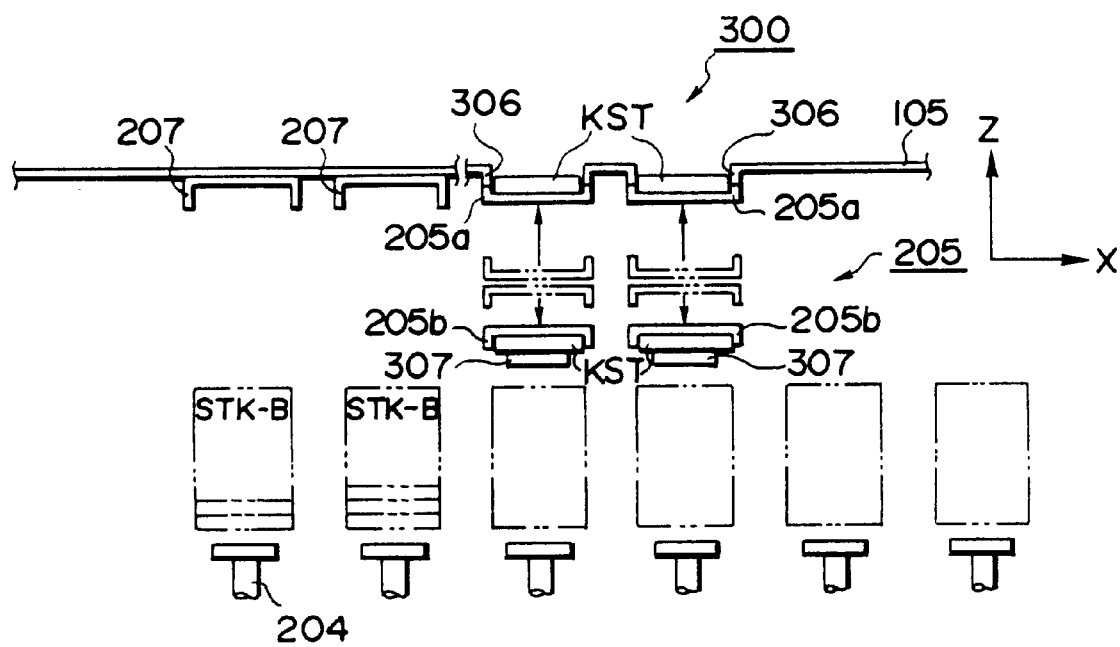
FIG. 34 is a sectional view corresponding to FIG. 10 for explaining a tray handling method in a third embodiment of the present invention.

Further, as shown in FIG. 33, the tray transfer arm 205 is made to move in the X-direction to the position directly above the elevator table 307. In that position, as shown in FIG. 34, the upper side tray holder 205a is made to rise to the window 306 of the loader section 400 and the lower side tray holder 205b is made to descend to the elevator table 307. The upper side tray holder 205a is made to rise by operating the first fluid pressure cylinder 36, while the lower side tray holder 205b is made to descend by operating the second fluid pressure cylinder 37.

By closing the holding hooks 306a provided at the window 306 of the loader section 300 in the state shown in FIG. 34, the upper side tray holder 205a holds the full customer tray KST conveyed there. Further, by closing the hooks 40 provided at the lower side tray holder 205b, the empty customer tray KST carried on the elevator table 307 is held at the lower side tray holder 205b.

Figure 35:
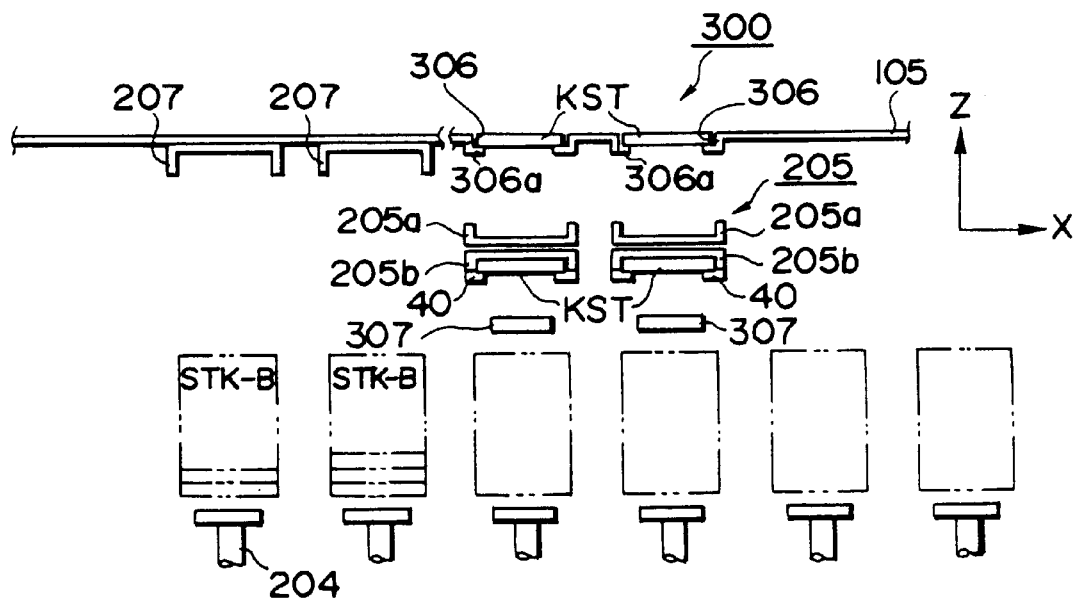
FIG. 35 is a sectional view corresponding to FIG. 10 for explaining a tray handling method in a third embodiment of the present invention.

This state is shown in FIG. 35. Since a full customer tray KST is set at the window 306 of the loader section 300, it is possible to reload the DUTs to be tested to the test tray TST later.

Figure 36:
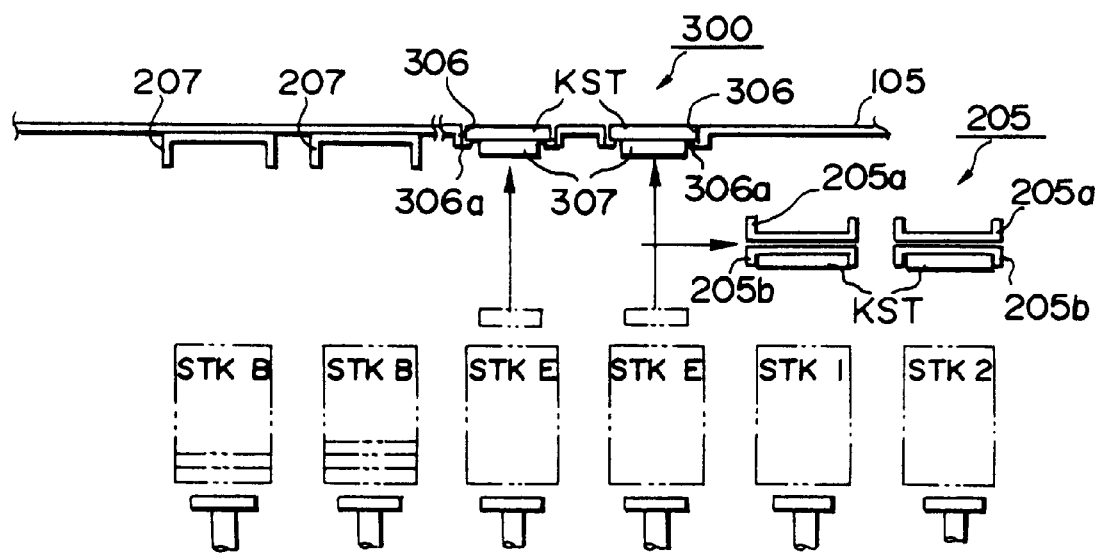
FIG. 36 is a sectional view corresponding to FIG. 10 for explaining a tray handling method in a third embodiment of the present invention.
Figure 37:
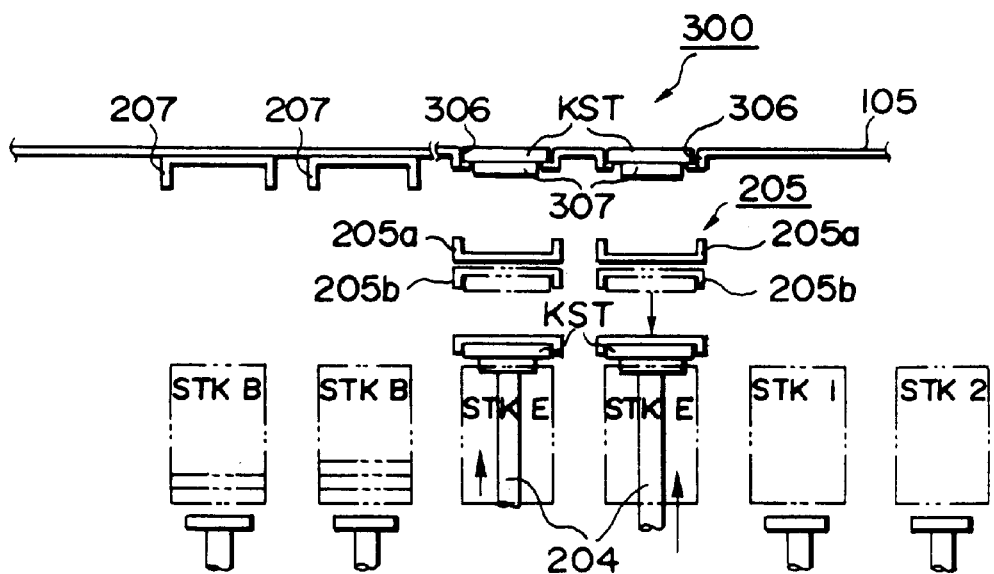
FIG. 37 is a sectional view corresponding to FIG. 10 for explaining a tray handling method in a third embodiment of the present invention.

The tray transfer arm 205 holding the two empty customer trays KST moves to the empty tray stockers STK-E of the post-test IC stockers 202 and stores the customer trays KST there. That is, first, as shown in FIG. 36, the tray transfer arm 205 is made to move once in the X-direction to return the elevator table 307 to the original position, then, as shown in FIG. 37, the tray transfer arm 205 s made to move in the X-direction to a position directly above the empty tray stocker STK-E. At that position, the lower side tray holder 205b of the tray transfer arm 205 is made to descend in the Z-direction.

Note that in the present embodiment, the windows 306 of the loader section 300 are provided directly above the empty tray stockers STK-E, so as shown in FIG. 36 the tray transfer arm 205 is moved away once in the X-direction, but when the windows 306 of the loader section 300 and the empty tray stockers STK-E are provided at different positions in the horizontal direction, the tray transfer arm 205 may be moved as it is to the empty tray stockers STK-E.

At the same time as this, the elevator 204 of the empty stocker STK-E is made to rise to pick up an empty customer tray KST. When the elevator 204 reaches the lower side tray holder 205b, the hooks 40 of the tray holder 205b open and the empty customer tray KST is reset on the elevator 204. By making the elevator 204 descend to the original position, the empty customer tray KST can be stored in the empty tray stocker STK-E.

In this way, according to the IC testing apparatus 1 of this embodiment, when exchanging an empty customer tray KST and customer tray KST for next testing at the loader section 300, as shown in FIG. 34, the tray transfer arm 205 can simultaneously receive the empty tray and deliver a full tray at that position without movement, so the exchange process becomes shorter by that amount and the speed of exchanging trays is raised. Further, since the full tray is set in the loader section 300 before the exchange process, that is, at the step shown in FIG. 34, even if the transfer of the empty tray remains, the work of reloading DUTs to the test tray at the loader section 300 can be stored and therefore the throughput of the IC testing apparatus is improved.

Further, since the pitch P1 of the two pairs of the tray holders 205 is set equal to the pitch P7 of the tray setting apparatuses 206, the pitches P3, P4, and P5 of the windows 306, 406 of the loader section 300 and unloader section 400, and the pitch P6 of the stockers STK of the IC magazine 200 (see FIG. 10), it is possible to make the two customer trays KST move simultaneously at the same position and thereby raise the speed of exchange.

Note that the embodiments explained above were given for facilitating the understanding of the present invention and were not given for limiting the invention. Therefore, elements disclosed in the above embodiments include all design modifications and equivalents belonging to the technical scope of the present invention.

As explained above, according to the present invention, the operation steps at the time of exchange of trays is reduced and the throughput of the work for reloading ICs etc. is further improved. Further, the tray transfer arm of the present invention is provided with a pair of tray holders substantially in the vertical direction, so when applied to an IC testing apparatus enables the range of movement in the horizontal direction to be broadened.

What is claimed is:

1. A tray transfer arm for transferring one or more trays which hold semiconductor devices comprising a pair of tray holders which are provided substantially in the upper and lower direction, wherein said pair of tray holders are provided facing away from each other.

2. A tray transfer arm as set forth in claim 1, further comprising a drive which makes said pair of tray holders move independently substantially in the upper and lower direction.

3. An IC testing apparatus which inserts a first type of tray on which semiconductor devices are carried into a loader section, reloads the semiconductor devices to a second type of tray to be conveyed through a test process, inserts the second type of tray into the test process to test the semiconductor devices, stores the test results for each semiconductor device, takes out the second type of tray finished being tested to an unloader section, and reloads the semiconductor devices from the second type of tray to the first type of tray in accordance with the test results and ejects the first type of tray finished being reloaded with the semiconductor devices from the second type of tray in the unloader section from that unloader section and inserts another first type of tray into that unloader section comprising:

a tray transfer arm which has at least one pair of tray holders provided substantially in the upper and lower direction and provided to be able to store the first type of tray, the pair of tray holders facing away from each other.

4. An IC testing apparatus as set forth in claim 3, further comprising a drive which makes the pair of tray holders move independently in substantially the upper and lower direction.

5. An IC testing apparatus as set forth in claims 3 or 4, further comprising a tray elevator table which carries the first type of tray set in the unloader section and moves it substantially in the upper and lower direction.

6. An IC testing apparatus as set forth in claims 3 or 4, further comprising a tray setter which sets another type of tray in one of the tray holders of said tray transfer arm.

7. An IC testing apparatus as set forth in claims 3 or 4, further comprising a holder which is provided at the unloader section and holds the first type of tray.

8. An IC testing apparatus as set-forth in claims 3 or 4, wherein a plurality of pairs of unloader sections are provided substantially in the horizontal direction and a plurality of pairs of tray holders of said tray transfer arm are provided substantially in the horizontal direction at the same pitch as the unloader sections.

9. An IC testing apparatus as set forth in claims 3 or 4, wherein one of the tray holders of said tray transfer arm can temporarily receive a first type of tray in the middle of reloading of semiconductor devices in the unloader section.

10. An IC testing apparatus which inserts a first type of tray on which semiconductor devices are carried into a loader section, reloads the semiconductor devices to a second type of tray to be conveyed through a test process, inserts the second type of tray into the test process to test the semiconductor devices, stores the test results for each semiconductor device, takes out the second type of tray finished being tested to an unloader section, and reloads the semiconductor devices from the second type of tray to the first type of tray in accordance with the test results and ejects the first type of tray finishing reloading the semiconductor devices to the second type of tray in the loader sector from that loader section and inserts the first type of tray loaded with the semiconductor devices to be tested next into that loader section, a tray transfer arm which has at least one pair of tray holders provided substantially in the upper and lower direction and provided to be able to store the first type of tray, the pair of tray holders facing away from each other.

11. An IC testing apparatus as set forth in claim 10, further comprising a drive which makes the pair of tray holders move independently in substantially the upper and lower direction.

12. An IC testing apparatus as set forth in claims 10 or 11, further comprising a tray elevator table which carries the first type of tray set in the loader section and moves it substantially in the upper and lower direction.

13. An IC testing apparatus as set forth in claims 10 or 11, further comprising a tray setter which sets another type of tray in one of the tray holders of said tray transfer arm.

14. An IC testing apparatus as set forth in claims 10 or 11, further comprising a holder which is provided at the loader section and holds the first type of tray.

15. An IC testing apparatus as set forth in claims 10 or 11, wherein a plurality of pairs of loader sections are provided substantially in the horizontal direction and a plurality of pairs of tray holders of said tray transfer arm are provided substantially in the horizontal direction at the same pitch as the loader sections.

16. An IC testing apparatus as set forth in any one of claims 3, 4, 10, 11, further comprising a sensor which detects if the first type of tray is stored in the tray holder.

* * * * *